(12) United States Patent
Sato

(10) Patent No.: US 6,680,522 B1
(45) Date of Patent: Jan. 20, 2004

(54) SEMICONDUCTOR DEVICE WITH REDUCED ELECTRICAL VARIATION

(75) Inventor: Fumihiko Sato, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/474,504

(22) Filed: Dec. 29, 1999

(30) Foreign Application Priority Data

Jan. 11, 1999 (JP) ............................................ 11-004685

(51) Int. Cl.$^7$ ............................................ H01L 27/082
(52) U.S. Cl. ........................................ 257/588; 257/587
(58) Field of Search ................................ 257/565, 566, 257/592, 587, 588

(56) References Cited

U.S. PATENT DOCUMENTS

| | | | |
|---|---|---|---|
| 5,235,206 A | * 8/1993 | Desilets et al. | .............. 257/578 |
| 5,391,503 A | 2/1995 | Miwa et al. | |
| 5,432,104 A | 7/1995 | Sato | |
| 5,506,427 A | 4/1996 | Imai | |
| 5,583,059 A | * 12/1996 | Burghartz | ..................... 437/31 |
| 5,773,350 A | 6/1998 | Herbert et al. | |
| 6,069,399 A | * 5/2000 | Patti | ........................... 257/592 |

FOREIGN PATENT DOCUMENTS

| | | | | |
|---|---|---|---|---|
| JP | 63-217663 | | 9/1988 | |
| JP | 4-37143 | | 2/1992 | |
| JP | 4-105325 | * | 4/1992 | ......... H01L/21/331 |
| JP | 5-41384 | | 2/1993 | |
| JP | 5-74789 | | 3/1993 | |
| JP | 5-235017 | | 9/1993 | |
| JP | 6-151447 | | 5/1994 | |
| JP | 6-168951 | | 6/1994 | |
| JP | 7-106341 | | 4/1995 | |
| JP | 2551353 | | 8/1996 | |
| JP | 9-115921 | | 5/1997 | |
| JP | 10-209172 | | 8/1998 | |
| JP | 10-256269 | | 9/1998 | |

* cited by examiner

Primary Examiner—Ori Nadav
(74) Attorney, Agent, or Firm—Choate, Hall & Stewart

(57) ABSTRACT

An object of the invention is to minimize variation in characteristics of a vertical bipolar transistor. An insulating side wall spacer composed of a silicon nitride film 10 and a silicon oxide film 9 is formed on the side surface of an opening 101 formed in a base electrode polysilicon film 7. The thickness ($=W_D$) of the insulating side wall spacer is made thicker than the maximum thickness ($=W_F$) within a range of variation in thickness of a polycrystalline film 12 grown from the side surface of the base electrode polysilicon film 7 exposed inside the opening 101 (namely, $W_D > W_F$). The size of an opening for forming an emitter electrode polysilicon film 16 on an intrinsic base 11 is not influenced by the thickness of a polycrystalline film 12 epitaxially growing from the side surface of the polysilicon film 7 for the base electrode, but is defined by the side wall spacer formed on a portion of the side surface of the base electrode polysilicon film. Therefore, emitter area hardly disperses, and electric characteristics become stable.

16 Claims, 17 Drawing Sheets

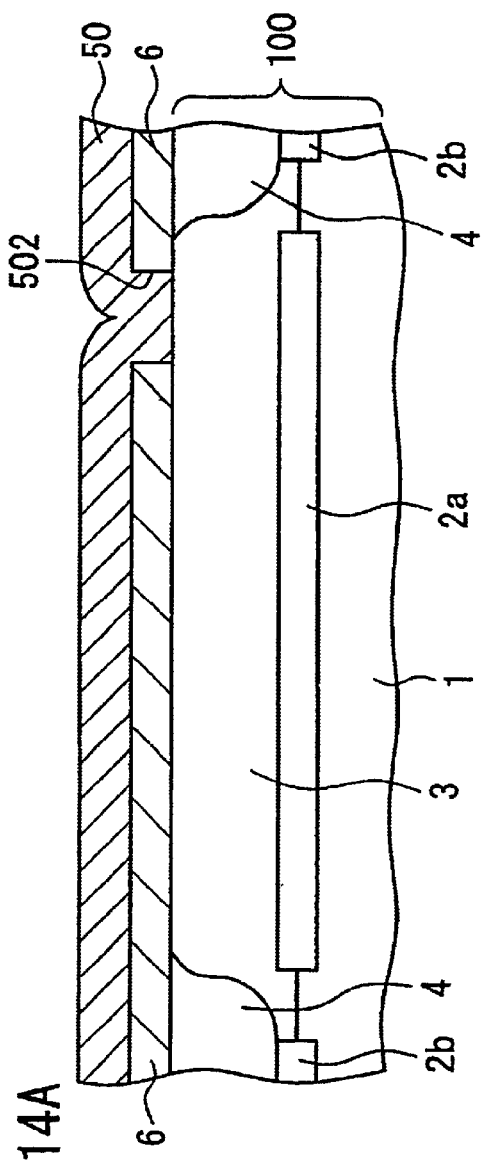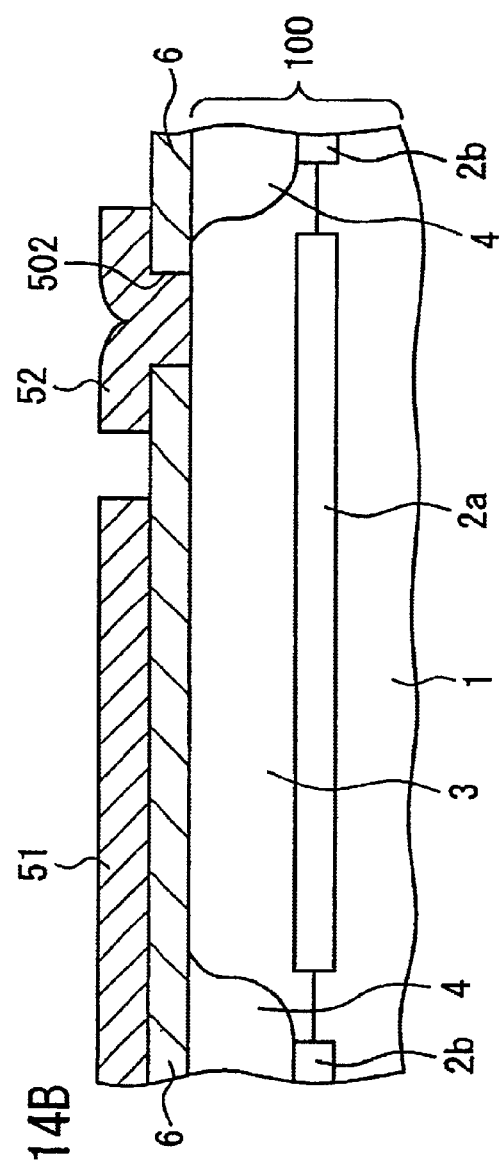

PRIOR ART

SEMICONDUCTOR DEVICE WITH REDUCED ELECTRICAL VARIATION

FIELD OF THE INVENTION

The present invention relates generally to a semiconductor device and a method of manufacturing the semiconductor device, and more particularly to a transistor such as a vertical bipolar transistor, a field effect transistor or the like and its manufacturing method in which variation of electrical characteristic can be remarkably suppressed.

BACKGROUND OF THE INVENTION

The inventor of the present invention have proposed a vertical bipolar transistor and its manufacturing method which vertical bipolar transistor has a high cut-off frequency and in which reliable interconnection between conductor films or regions can be attained, in Japanese Patent No.2,551,353. FIG. 16 is a rough sectional view of a conventional vertical bipolar transistor similar to the vertical bipolar transistor disclosed in Japanese Patent No.2,551,353.

In FIG. 16, reference number 201 shows a p-type silicon substrate which has a surface of (100) plane and an electrical resistivity of 10 to 20 Σ-cm. Two kinds of buried layers of a few micrometers in thickness are formed on the surface of the silicon substrate 1. The two kinds of buried layers are an n+ type buried layer 202a and a channel stopper p+ type buried layer 202b, which exist separately from each other. A collector n− type epitaxial silicon layer 203 is formed on the surfaces of these buried layers and on the surface of an area of the silicon substrate 201 where these buried layers do not exist. A silicon oxide film 204 is selectively formed to the depth reaching the p+ type buried layer 202b, and the silicon oxide film 204 forms an element isolation film. An n+ type collector lead-out region 205 connected to the n+ type buried layer 202a is formed by doping impurities in high concentration into a part of the collector n− type epitaxial silicon layer 203. The portions described so far are collectively called a silicon basic body 200.

A silicon oxide film 206 is formed on the silicon basic body 200, and a base electrode p+ type polysilicon film 207 is selectively formed on the silicon oxide film 206. And the base electrode polysilicon film 207 is covered with a silicon nitride film 208. An opening 301 is formed so as to penetrate the silicon nitride film 208 and the base electrode p+ type polysilicon film 207, and an opening 302 is formed so as to penetrate the silicon oxide film 206. A collector epitaxial silicon layer 203 is partially exposed by these openings. This first opening 301 formed in the polysilicon film 207 is projected horizontally over the opening 302 from the edge of the second opening 302. That is to say, the width of the second opening 302 is larger than the width of the first opening 301.

A p+ type single crystal silicon intrinsic base 211 is formed on the collector epitaxial silicon layer 203 which is exposed by the second opening 302. A p+ type polysilicon film 212 is formed on the side surface and the exposed lower surface of the base electrode polysilicon film 207. Thus, the p+ type polysilicon film 212 connects the base electrode polysilicon film 207 and the intrinsic base 211 to each other.

An n++ type single crystal silicon emitter region 215 is provided in the middle area on the p+ type single crystal silicon intrinsic base 211. A silicon oxide film 213 is formed so as to over the side wall of the opening. In the collector epitaxial silicon layer 203 directly under the base region and between the intrinsic base 211 and the n+ type buried layer 202a, there is formed an n type silicon collector region 214 in which the concentration of impurities is higher than that of impurities in the original collector epitaxial silicon layer 203. An emitter electrode n++ type polysilicon 216 is provided on the n++ type single crystal silicon emitter region 215. These regions are all covered with a silicon oxide film 217.

Moreover, contact holes 303a, 303b and 303c which penetrate the silicon oxide film 217 and, depending upon places, penetrates also the silicon nitride film 208 and the silicon oxide film 206 are formed. Also, a metal film of aluminum-based alloy and the like is formed so as to fill these contact holes 303a, 303b and 303c, and furthermore a patterning process is applied to this metal film to form an emitter electrode 218a, a base electrode 218b and a collector electrode 218c. These emitter electrode 218a, base electrode 218b and collector electrode 218c composed of aluminum-based alloy are respectively in contact with the emitter electrode polysilicon 216, base electrode polysilicon film 207 and collector lead-out region 205.

A vertical bipolar transistor of the above-mentioned configuration shown in FIG. 16 has an adequate high-speed operation characteristic, but has a problem of large variation or dispersion in an operating current. Concretely speaking, it can be explained as follows. In a bipolar transistor circuit, a differential transistor pair is formed by short-circuiting with each other the emitters of adjacent transistors. It is assumed that voltages to be applied to the bases so that the collector currents of the respective transistors of the differential transistor pair become equal to each other are respectively VB1 and VB2. If the absolute value of the difference between these voltages, namely, the absolute value of "VB1−VB2" is defined as ΔVB, the smaller this ΔVB is, the more stable the circuit operation becomes. The reason is that in case that some number of stages of differential transistor pairs are combined inside the circuit, necessary input potentials vary due to occurrence of changeover among the differential transistor pairs. A vertical type bipolar transistor of the above-mentioned configuration shown in FIG. 16 has a large value of this ΔVB.

On the other hand, in a vertical bipolar transistor disclosed in Japanese Patent No.2,551,353, such a problem does not occur. This is because, the side surface of a base electrode polysilicon film is completely covered with an insulating film such as a silicon nitride film. However, in a vertical bipolar transistor disclosed in Japanese Patent No.2,551,353, the film thickness $W_H$ of an intrinsic base single crystal film formed by a selective crystal growth method is thinner than the spacing $W_I$ between the upper surface of the collector epitaxial silicon layer and the lower surface of the base electrode polysilicon film ($W_H<W_I$). Therefore, if the film thickness of a polysilicon film which selectively crystal-grows on the lower surface of the base electrode polysilicon film becomes too thin, another problem may occur that the intrinsic base is not connected to the base electrode polysilicon film. Thus, in the vertical bipolar transistor disclosed in Japanese Patent No. 2,551,353, it is necessary to strictly control a manufacturing process to avoid occurrence of such problem, and it is difficult to easily improve manufacturing yield and manufacturing cost.

Also, in the vertical bipolar transistor disclosed in Japanese Patent No. 2,551,353, in order to surely contact the intrinsic base and the base electrode polysilicon film, it is possible to consider that the film thickness $W_H$ of an intrinsic base single crystal film formed by a selective crystal growth method can be made thicker than the spacing $W_I$ between the upper surface of the collector epitaxial silicon layer and the lower surface of the base electrode polysilicon film ($W_H > W_I$). However, in such case, it has been found that there is a possibility that the intrinsic base single crystal film directly contacts the silicon nitride film covering the side wall of the base electrode polysilicon film and, thereby, a leak current of the bipolar transistor increases. The reason for this is considered that when the intrinsic base single crystal film contacts the silicon nitride film; stress increases in the vicinity of the interface between the intrinsic base single crystal film and the silicon nitride film and, in an extreme case, crystal defect occurs in the proximity of the interface between the intrinsic base single crystal film and the silicon nitride film.

SUMMARY OF THE INVENTION

Hereupon, an object of the present invention is to provide a semiconductor device and its manufacturing method which can solve the above-mentioned problems in the prior art.

It is another object of the present invention to provide a semiconductor device whose electric characteristics do not vary largely and to provide a method of manufacturing such semiconductor device.

It is still another object of the present invention to provide a semiconductor device which has stable and superior electric characteristics and to provide a method of manufacturing such semiconductor device.

It is still another object of the present invention to provide a semiconductor device and its manufacturing method in which electrical contacts can be reliably formed.

It is still another object of the present invention to provide a semiconductor device and its manufacturing method in which manufacturing yield of the semiconductor device is improved.

It is still another object of the present invention to provide a semiconductor device and its manufacturing method in which electric characteristics of the semiconductor device do not vary and in which increase in a leak current of the semiconductor device can be avoided.

According to one aspect of the present invention, there is provided a semiconductor device comprising: a single crystal semiconductor substrate of a first conductivity type; a first insulating film which is formed on the main surface of said single crystal semiconductor substrate and which has a first opening having a first width to expose a portion of said main surface of said single crystal semiconductor substrate; a first semiconductor layer formed on at least a portion of the first insulating film and having a second conductivity type opposite to the first conductivity type; a second insulating film formed on the first insulating film so as to cover the first semiconductor layer; a second opening which is formed so as to penetrate the first semiconductor layer and the second insulating film and which is positionally aligned with the first opening, the second opening having a second width which is less than the first width, so that the side surface of the first semiconductor layer corresponding to the inner wall surface of the second opening projects toward the inner portion of the first opening from the side surface of the first insulating film corresponding to the inner wall surface of the first opening; an insulating side wall spacer formed at least on a portion of the side surface of the first semiconductor layer or of the side surface of the second insulating film corresponding to the inner wall surface of the second opening so as to expose the lower portion of the side surface of the first semiconductor layer corresponding to the inner wall surface of the second opening; a second semiconductor layer composed of a single crystal semiconductor of the second conductivity type formed on the portion of the main surface of the single crystal semiconductor substrate exposed at the bottom surface of the first opening; a third semiconductor layer of the second conductivity type for joining the exposed lower portion of the side surface of the first semiconductor layer corresponding to the inner wall surface of the second opening, and a portion of the lower surface of the first semiconductor layer in the proximity of the side surface of the first semiconductor layer corresponding to the inner wall surface of the second opening, to the end portion of the second semiconductor layer; a fourth semiconductor layer of the first conductivity type formed at a region in the proximity of the upper surface of the second semiconductor layer; and a fifth semiconductor layer of the first conductivity type formed on the upper surface of the second semiconductor layer.

In this case, it is preferable that the thickness of the third semiconductor layer is smaller than the thickness of the insulating side wall spacer.

It is also preferable that the single crystal semiconductor substrate is made out of single crystal silicon, the first semiconductor layer is made out of polysilicon, the second semiconductor layer is made out of single crystal silicon, and the third and fifth semiconductor layers are made out of polysilicon.

It is further preferable that the single crystal semiconductor substrate is made out of single crystal silicon, the first semiconductor layer is made out of polysilicon, the second semiconductor layer is made out of single crystal SiGe, the third semiconductor layer is made out of polycrystalline SiGe, and the fifth semiconductor layer is made out of polysilicon.

It is advantageous that the single crystal semiconductor substrate is made out of single crystal silicon, the first semiconductor layer is made out of single crystal silicon, the second semiconductor layer is made out of single crystal silicon, the third semiconductor layer is made out of single crystal silicon, and the fifth semiconductor layer is made out of polysilicon.

It is also advantageous that the insulating side wall spacer is formed by a first insulating side wall spacer portion formed on a portion of the side surface of the first semiconductor layer and of the side surface of the second insulating film corresponding to the inner wall surface of the second opening so as to expose the lower portion of the side surface of the first semiconductor layer corresponding to the inner wall surface of the second opening, and a second insulating side wall spacer portion which is formed on the first insulating side wall spacer portion, and wherein the length of the second insulating side wall spacer portion along the direction parallel to the inner wall of the second opening is longer than the length of the first insulating side wall spacer portion along the direction parallel to the inner wall of the second opening.

It is also preferable that the semiconductor device further comprising: a third, insulating film which covers at least partially the insulating side wall spacer and the second semiconductor layer.

It is further preferable that at least a portion of the first semiconductor layer is made out of single crystal semiconductor, the second opening penetrates the portion made out of single crystal semiconductor of the first semiconductor layer, and the third semiconductor layer is made out of single crystal semiconductor.

According to another aspect of the present invention, there is provided a semiconductor device comprising: a single crystal semiconductor substrate of a first conductivity type; a first insulating film formed on the main surface of the single crystal semiconductor substrate and having a first opening which exposes a portion of the main surface of the single crystal semiconductor substrate, the first opening having a first opening width; a first semiconductor layer of a second conductivity type opposite to the first conductivity type formed on at least a portion of the first insulating film, at least a portion of the first semiconductor layer being made out of single crystal semiconductor; a second insulating film formed on the first insulating film so as to cover the first semiconductor layer; a second opening formed so as to penetrate the first semiconductor layer and the second insulating film, be positionally aligned with the first opening, the second opening penetrating the portion made out of single crystal semiconductor of the first semiconductor layer and having a second opening width which is smaller than the first opening width, so that the side surface of the first semiconductor layer corresponding to the inner wall surface of the second opening projects toward the inside of the first opening from than the side surface of the first insulating film corresponding to the inner wall surface of the first opening; a second semiconductor layer made of single crystal semiconductor of the second conductivity type formed on the portion of the main surface of the single crystal semiconductor substrate which expose at the bottom surface of the first opening; a third semiconductor layer made of single crystal semiconductor of the second conductivity type for joining the side surface portion of the first semiconductor layer corresponding to the inner wall surface of the second opening, and the portion in the proximity of the side surface of the first semiconductor layer corresponding to the inner wall surface of the second opening in the lower surface of the first semiconductor layer, to the end portion of the second semiconductor layer; a fourth semiconductor layer of the first conductivity type formed at an area in the proximity of the upper surface of the second semiconductor layer; and a fifth semiconductor layer of the first conductivity type formed on the upper surface of the second semiconductor layer.

According to still another aspect of the present invention, there is provided a method of manufacturing a semiconductor device comprising: preparing a single crystal semiconductor substrate of a first conductivity type; forming a first insulating film on the main surface of the single crystal semiconductor substrate; forming. a first semiconductor layer of a second conductivity type opposite to the first conductivity type on at least a portion the first insulating film; forming a second insulating film on the first insulating film so as to cover the first semiconductor layer; selectively removing the first semiconductor layer and the second insulating film to form a first opening, the first opening having a first opening width and, at the bottom surface of the first opening, a portion of the first insulating film being exposed; forming a third insulating film on the inner wall surface and the bottom surface of the first opening and on the upper surface of the second insulating film; forming a fourth insulating film on the third insulating film, the fourth insulating film being made of different material from that of the third insulating film; etching back the third and fourth insulating films, leaving an insulating film side wall spacer formed of portions of the third and fourth insulating film on the inner wall surface of the first opening, and removing other portions of the third and fourth insulating film; removing the portion of the first insulating film exposed in the first opening and the exposed portion of the third insulating film portion forming the insulating film side wall spacer and thereby forming a second opening, the second opening having a second opening width which is larger than the first opening width, a portion of the main surface of the single crystal semiconductor substrate being exposed at the bottom surface of the second opening, the side surface of the first semiconductor layer corresponding to the inner wall surface of the first opening projecting toward the inside portion of the second opening from the side surface of the first insulating film corresponding to the inner wall surface of the second opening, leaving at least a portion of the third insulating film portion forming the insulating film side wall spacer on the inner wall surface of the first opening, exposing the lower portion of the side surface of the first semiconductor layer corresponding to the inner wall surface of the first opening, and exposing a portion of the lower surface of the first semiconductor layer in the proximity of the side surface of the first semiconductor layer corresponding to the inner wall surface of the first opening; growing a second semiconductor layer made out of single crystal semiconductor of the second conductivity type on the portion of the main surface of the single crystal semiconductor substrate exposed at the bottom surface of the second opening, and growing a third semiconductor layer of the second conductivity type from the exposed lower portion of the side surface of the first semiconductor layer corresponding to the inner wall surface of the first opening and from the exposed portion of the lower surface of the first semiconductor layer, the second semiconductor layer and the third semiconductor layer joining to each other; forming a fourth semiconductor layer of the first conductivity type on the upper surface of the second semiconductor layer; and forming a fifth semiconductor layer of the first conductivity type at the region in the proximity of the upper surface of the second semiconductor layer.

In this case, it is preferable that the thickness of the portion of the third semiconductor layer grown from the exposed lower portion of the side surface of the first semiconductor layer corresponding to the inner wall surface of the first opening along the direction perpendicular to the inner wall surface of the first opening is smaller than the thickness of the insulating film side wall spacer along the direction perpendicular to the inner wall surface of the first opening.

It is also preferable that the thickness of the insulating film side wall spacer along the direction perpendicular to the inner wall surface of the first opening is larger than the maximum value in the range of dispersion of the thickness of growth of the third semiconductor layer in the growing the third semiconductor layer.

It is further preferable that the thickness of the third insulating film formed in the forming the third insulating film is made thicker than the maximum value in the range of dispersion of the thickness of growth of the third semiconductor layer in the growing the third semiconductor layer.

It is advantageous that the thickness of growth of the second semiconductor layer in the growing the second semiconductor layer is made larger than the thickness of the first insulating film formed in the forming the first insulating film, and is made smaller than the sum of the thickness of the first insulating film formed in the forming the first insulating film and the thickness of the third insulating film formed in the forming the third insulating film.

It is also advantageous that the single crystal semiconductor substrate is formed out of single crystal silicon, the first semiconductor layer is formed out of polysilicon, the second semiconductor layer is formed out of single crystal silicon, and the third semiconductor layer is formed out of polysilicon.

It is further advantageous that the single crystal semiconductor substrate is formed out of single crystal silicon, the first semiconductor layer is formed out of polysilicon, the second semiconductor layer is formed out of single crystal SiGe, and the third semiconductor layer is formed out of polycrystalline SiGe.

It is preferable that the single crystal semiconductor substrate is formed out of single crystal silicon, the first semiconductor layer is formed out of single crystal silicon, the second semiconductor layer is formed out of single crystal silicon, and the third semiconductor layer is formed out of single crystal silicon.

It is also preferable that the fourth semiconductor layer is made out of polycrystalline semiconductor of the first conductivity type which includes impurities of the first conductivity type in a high concentration, and wherein, in the forming the fifth semiconductor layer of the first conductivity type at the region in the proximity of the upper surface of the second semiconductor layer, the fifth semiconductor layer of the first conductivity type is formed at the region in the proximity of the upper surface of the second semiconductor layer by diffusing the impurities of the first conductivity type from the fourth semiconductor layer into the second semiconductor layer.

It is further preferable that the method further comprising: forming a fifth insulating film which covers at least partially the remaining portion of the insulating film side wall spacer and the second semiconductor layer and which defines the exposed portion of the second semiconductor layer, after growing a second semiconductor layer made out of single crystal semiconductor of the second conductivity type on the portion of the main surface of the single crystal semiconductor substrate exposed at the bottom surface of the second opening, and growing a third semiconductor layer of the second conductivity type from the exposed lower portion of the side surface of the first semiconductor layer corresponding to the inner wall surface of the first opening and from the exposed portion of the lower surface of the first semiconductor layer, and before forming a fourth semiconductor layer of the first conductivity type on the upper surface of the second semiconductor layer; and wherein, in the forming a fourth semiconductor layer of the first conductivity type on the upper :surface of the second semiconductor layer, a fourth semiconductor layer made of polycrystalline semiconductor including impurities of the first conductivity type in a high concentration is formed on at least the exposed portion of the second semiconductor layer defined by the fifth insulating film.

It is preferable that the method of manufacturing a semiconductor device further comprising: single crystallizing at least a portion of the first semiconductor layer, after forming a first semiconductor layer of a second conductivity type opposite to the first conductivity type on at least a portion the first insulating film, and before forming a second insulating film on the first insulating film so as to cover the first semiconductor layer; and wherein the first opening is formed within the single-crystallized portion of the first semiconductor layer, and the third semiconductor layer is made out of single crystal semiconductor.

According to still another aspect of the present invention, there is provided a method of manufacturing a semiconductor device comprising: preparing a single crystal semiconductor substrate of a first, conductivity type; forming a first insulating film on the main surface of the single crystal semiconductor substrate; forming: a first semiconductor layer of a second conductivity type opposite to the first conductivity type on at least a portion of the first insulating film; single crystallizing at least a portion of the first semiconductor layer; forming a second insulating film on the first insulating film so as to cover the first semiconductor layer; selectively removing the first semiconductor layer and the second insulating film and thereby forming a first opening, the first opening being formed within a single-crystallized portion of the first semiconductor layer and having a first opening width, and, at the bottom surface of the first opening, a portion of the first insulating film being exposed; removing the portion of the first insulating film exposed within the first opening and thereby forming a second opening in the first insulating film, the second opening having a second opening width which is larger than the first opening, a portion of the main surface of the single crystal semiconductor substrate being exposed at the bottom surface of the second opening, the side surface of the first semiconductor layer corresponding to the inner wall surface of the first opening projects toward inside of the second opening from the side surface of the first insulating film corresponding to the inner wall surface of the second opening, the side surface of the first semiconductor layer corresponding to the inner wall surface of the first opening being exposed, and a portion of the lower surface of the first semiconductor layer in the proximity of the side surface of the first semiconductor layer corresponding to the inner wall surface of first opening being exposed; growing a second semiconductor layer made out of single crystal semiconductor of the second conductivity type on the portion of the main surface of the single crystal semiconductor substrate exposed at the bottom surface of the second opening, and growing a third semiconductor layer made out of single crystal semiconductor of the second conductivity type on the exposed side surface portion of the first semiconductor layer corresponding to the inner wall surface of the first opening and on the exposed portion of the lower surface of the first semiconductor layer, the second semiconductor layer and the third semiconductor layer joining to each other; forming a fourth semiconductor layer of the first conductivity type on the upper surface of the second semiconductor layer; and forming a fifth semiconductor layer of the first conductivity type at a region in the proximity of the upper surface of the second semiconductor layer.

Inventor of the present invention have studied the cause of the above-mentioned problems in the prior art. In the following, the cause is described with reference to a vertical bipolar transistor as an example, but with reference to a field effect transistor, it is possible to consider the cause in the same way.

FIGS. 17A through 17C and FIGS. 18A through 18C illustrate schematic partial cross sectional structures obtained during a conventional manufacturing process of a portion around the intrinsic base 211 in the conventional vertical bipolar transistor shown in FIG. 16. With reference to FIG. 17A, the collector epitaxial silicon layer 203 of the silicon basic body 200 is fabricated by using any appropriate method. On the collector epitaxial silicon layer 203, the silicon oxide film 206, the p+type base electrode polysilicon film 207 and the silicon nitride film 208 are formed in this order. In this case, the polysilicon film 207 is patterned in areas not shown in the drawing by using, for example, photolithography and etching, before forming the silicon nitride film 208.

Then, as shown in FIG. 17B, an opening 301 is formed so as to penetrate a silicon nitride film 208 and a polysilicon film 207 by using, for example, photolithography and etching. Also, as shown in FIG. 17C, an opening 302 is formed so as to penetrate a silicon oxide film 206 by using etching and the like. By these openings 301 and 302, a portion of the collector epitaxial layer 203, and a side wall surface portion 207a and a portion 207b of the lower surface of the base electrode polysilicon film 207 are exposed. Next, as., shown in FIG. 18A, a p+ type single crystal silicon intrinsic base 211 is formed on the exposed portion of the collector epitaxial silicon layer 203 by means of a vapor phase epitaxial growth method, and at the same time a p+ type polysilicon film 212 is formed on the exposed portion 207a of the side surface and the exposed portion 207b of the lower surface of the base electrode polysilicon film 207. Since the collector epitaxial silicon layer 203 is a single crystal, the p+ type single crystal intrinsic base 211 formed on the collector layer 203 becomes a single crystal in the same way. On the other hand, since the base electrode polysilicon film 207 is polycrystalline, the p+ type silicon film 212 formed on the exposed portion 207a of the side surface and the exposed portion 207b of the lower surface of the base electrode polysilicon film 207 becomes polycrystalline in the same way. Moreover, after a silicon oxide film has been formed so as to cover the whole area of the substrate, the silicon oxide film spacer 213 is formed so as to cover the inner side wall of the opening 301, by etching back of the silicon oxide film by means of an an isotropic etching process. After this, as shown in FIG. 18C, an n++ type emitter electrode polysilicon 216 is formed by depositing and patterning n++ polysilicon. By performing a heat treatment after this, an n type impurity inside the n++ type emitter electrode polysilicon 216 is diffused into the surface area of the p+ type single crystal silicon intrinsic base 211 and an n++ type single crystal silicon emitter region 215 is formed. Thereby, a structure shown in FIG. 18C is obtained.

Hereupon, the inventor considered on the base electrode polysilicon film 207 in detail. It has been reported that in case that nondoped or additive-free (namely, no impurity added) polysilicon is deposited at a temperature within a range from approximately 600 to 650 degrees Celsius, the grain size in the deposited polysilicon film is 0.03 to 0.3 $\mu$m and its orientation is a {110}. And when impurities are doped into the polysilicon film and, thereafter, a heat treatment for activating impurity atoms is performed, the grain size in the polysilicon film becomes 0.5 to 3 $\mu$m, namely, larger than the grain size immediately after deposition. On the other hand, as in case of forming the opening 301, direction of crystal lattice planes of exposed surface of each grain at the exposed portion 207a of the side surface of the polysilicon film 207 formed by almost vertically dry-etching the polysilicon film is a direction perpendicular to the {110} plane, but if higher order direction of lattice planes is also considered, countless directions may exist.

On the other hand, an emitter region needs to become various sizes depending on the circuit structure. For example, the longitudinal dimension of an emitter can become about 2 $\mu$m to 16 $\mu$m or 32 $\mu$m. Moreover, it is preferable in design of a circuit that an effective emitter area corresponds to a designed emitter area and a collector current increases or decreases in proportion to the effective emitter area. And it is preferable that approximately the same collector currents flow through transistors having the same size.

In case that the longitudinal dimension of an emitter is small, a not so many number of crystal grains are exposed at the exposed portion 207a of the side surface of the polysilicon film 207. As described above, the direction of crystal lattice planes of the exposed surface of each crystal grain at the inner surface of the opening 301, that is, at the exposed portion 207a of the side surface of the polysilicon film 207 is the direction perpendicular to the {110} plane. However, when higher order direction of lattice planes is considered, there are various directions depending on the grains even in the same opening 301, and, also, when compared the directions with respect to a plurality of openings 301 with one another, there are different directions depending upon the respective openings 301. Epitaxial growth rate of silicon varies considerably depending upon the direction of crystal lattice planes of a surface which becomes a seed of growth. When compared the directions for every openings 301 with one another, especially in case of small openings 301, the directions of crystal lattice planes of grains exposed at the inner surface of the openings 301 are different from one another. As a result thereof, the thickness of the polysilicon film 212 epitaxially growing from the exposed portion 207a of the side surface and the exposed portion 207b of the lower surface of the base electrode polysilicon film 207, that is, the projection size $W_A$ considerably varies among openings 301.

That is to say, in a conventional example, an intrinsic base is formed by a selective epitaxial growth method in a condition where the side surface portion 207a of the base electrode polysilicon film 207 is completely exposed. Thus, the thickness $W_A$ of the polysilicon film 212 grown on the side surface portion 207a of the base electrode polysilicon film 207 varies among opening 301. Thereafter, a silicon oxide film is formed so as to cover the whole area of the substrate and then the silicon oxide film is etched back by means of an an isotropic etching process to form a silicon oxide film spacer 213 covering the inner side wall portion of the opening 301. In this case, even if the thickness of the silicon oxide film spacer 213 is constant, the thickness $W_A$ of the polysilicon film 212 varies among openings 301 and it is difficult to make it constant. As a result thereof, the size WB of the opening 304 defined by the silicon oxide film spacer 213 covering the inner side wall of the opening 301 varies among openings 301. That is to say, the exposed surface of a p+ type single crystal silicon intrinsic base 211 exposed by the opening 304 defined by the silicon oxide film spacer 213 varies in area. And by heat-treating an n++ type emitter electrode polysilicon 216 formed by depositing and patterning n++ polysilicon, an n type impurity inside the n++ type emitter electrode polysilicon 216 is diffused into the surface area of the p+ type single crystal silicon intrinsic base 211 and an n++ type single crystal silicon emitter region 215 is formed. Therefore, the n++ type single crystal silicon emitter region 215 also varies in size depending upon each opening 301. Namely, an emitter varies in area. As a result, it has become apparent that electric characteristics of a vertical bipolar transistor having such a constitution as described above and shown in FIG. 16 vary, and the above-mentioned ΔVB becomes large.

Thereupon, the inventor of the present invention have invented a manufacturing method and a structure of a transistor which is not influenced by the variation in the thickness of a polysilicon film epitaxially grown selectively from the side surface of a base electrode polysilicon film and which varies little in electric characteristics.

That is to say, according to a feature of the present invention, an insulating side wall spacer is formed on a part of the side surface of a first semiconductor layer corresponding to a base electrode polysilicon film, the thickness of the insulating side wall spacer $W_D$ is made thicker than the maximum thickness $W_F$ within a range of variation of the thickness $W_E$ of a polycrystalline film grown on the side surface of the base electrode polysilicon film, that is, the maximum thickness of the polycrystalline film (namely, $W_D > W_F$).

By this feature, even in case that there is variation in thickness $W_E$ of a polycrystalline film epitaxial-grown on the side surface of a base electrode polysilicon film, namely, even in case that there is variation in size of a projecting portion of the polycrystalline film projecting inward an opening formed in the base electrode polysilicon film, the size of the opening $W_G$ in an intrinsic base on which an emitter electrode polysilicon is deposited is not regulated by the size of the projecting portion of the polycrystalline film projecting inward the opening formed in the base electrode polysilicon film but is regulated by the side wall formed on a part of the side surface of the base electrode polysilicon film. As a result, variation in area of an emitter is greatly suppressed and the influence on its electric characteristics is made less.

Moreover, according to another feature of the present invention, a first semiconductor layer corresponding to a base electrode polysilicon is single-crystallized. As a result thereof, variation in size of a projecting portion of a semiconductor film projecting inward the opening formed in the base electrode polysilicon film and variation in area of an emitter is greatly suppressed and its influence on the electric characteristics is made less.

Also, an intrinsic base and a base electrode polysilicon film can be connected to each other only by the growth of a single crystal, by making the thickness $W_H$ of an intrinsic base single crystal film formed by means of a selective crystal growth method thicker than the spacing $W_I$ between the upper surface of a collector epitaxial silicon layer and the lower surface of the base electrode polysilicon film ($W_H > W_I$). Therefore, it is possible to avoid such a problem that an intrinsic base is not connected to a base electrode polysilicon film as the problem in case of a vertical bipolar transistor disclosed in Japanese Patent No.2,551,353.

Furthermore, by setting the relation among $W_H$, $W_I$ and the film thickness $W_C$ of an insulating film (which is other than silicon nitride) to first cover the side surface of the base electrode polysilicon film to be etched at the same time as when the surface of the collector epitaxial silicon layer is exposed by etching the insulating film immediately before its selective crystal growth as:

$$W_I < W_H < W_I + W_C,$$

the intrinsic base single crystal film is not directly in contact with a silicon nitride film. Thereby, it is possible to prevent the increase of such a leak current that should be taken into consideration in the design of a semiconductor device in case of a vertical bipolar transistor disclosed in Japanese Patent No.2,551,353.

BRIEF DESCRIPTION OF THE DRAWINGS

These and other features, and advantages, of the present invention will be more clearly understood from the following detailed description taken in conjunction with the accompanying drawings, in which like reference numerals designate identical or corresponding parts throughout the figures, and in which:

FIGS. 14A and 14B are vertical cross sectional views each showing a structure obtained during a process for manufacturing the semiconductor device of the fourth embodiment;

FIGS. 18A, 18B and 18C are vertical cross sectional views each showing a structure obtained, after the structure of FIG. 17C, during a process for manufacturing the conventional semiconductor device shown in FIG. 16.

DESCRIPTION OF A PREFERRED EMBODIMENT

Embodiments of the present invention are described with reference to the accompanying drawings in the following. First, an npn type bipolar transistor to which the present invention has been applied is described, but the present invention can be also applied to a pnp type bipolar transistor.

Also, as described later as another embodiment, the present invention can be also applied to a field effect transistor such as a JFET, an MOSFET and the like.

First Embodiment

Figure 1:
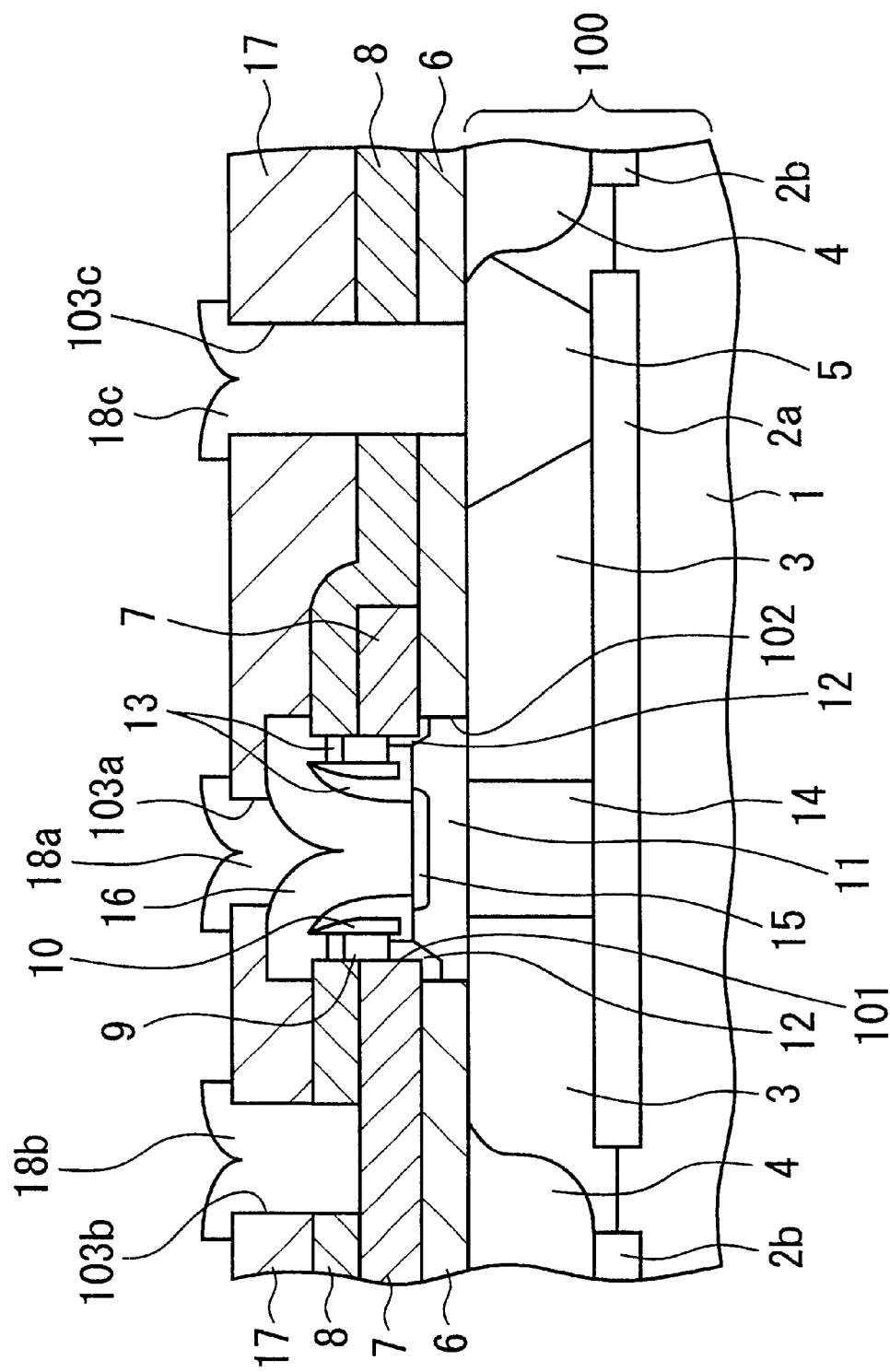
FIG. 1 is a vertical cross sectional view showing a semiconductor device of a first embodiment of the present invention.

FIG. 1 is a vertical cross sectional view of a semiconductor device of a first embodiment of the present invention.

A p– type silicon substrate 1 is prepared which has a surface of (100) plane and has an electrical resistivity from 10 to 20 Ωcm. Two kinds of buried layers are formed in an area of a few micrometers in thickness from the surface of a p– type silicon substrate 1. The two kinds of buried layers are an n+ type buried layer 2a and a channel stopper p+ type buried layer 2b, which exist separately from each other. An n– type epitaxial silicon layer 3 for a collector is formed on the surfaces of these buried layers 2a and 2b and on the surface of an area of the silicon substrate 1 where these buried layers 2a and 2b do not exist.

Impurities diffuse into the epitaxial layer slightly from the original buried layer area due to auto-doping and diffusion from the buried layer to the epitaxially grown layer during the epitaxial growth of the epitaxial silicon layer 3. In case the thickness of an effective epitaxial silicon layer for a collector is defined as the thickness of a region where the concentration of an n type impurity is $5 \times 10^{16}$ cm$^{-3}$ or less, the thickness of the epitaxial silicon layer for a collector was about 0.60 μm (micrometer).

For the purpose of element isolation, a silicon oxide film 4 is formed by a LOCOS (LOCal Oxidation of Silicon) method. The silicon oxide film 4 is formed by converting an epitaxial silicon layer for a collector into a silicon oxide layer to the depth reaching the p+ type buried layer 2b.

Also, an n+ type collector lead-out region 5 connected to the n+ type buried layer 2a is formed in a part of the n– type epitaxial layer for a collector by doping impurities into it in a high concentration. The portions described so far are collectively called a silicon basic body 100, and this silicon basic body 100 is considered also as a substrate. Because of the existence of the n– type epitaxial silicon layer 3, the silicon basic body 100 can be considered as an n– type substrate.

A silicon oxide film 6 is formed on the basic body 100 and a p+ type polysilicon film 7 for a base electrode is selectively formed on the silicon oxide film 6. An epitaxial silicon layer 3 for a collector is partially exposed by a first opening 101 formed in the p+ type base electrode polysilicon film 7 and a second opening 102 formed in the silicon oxide film 6. The width of the first opening 101 is smaller than the width of the second opening 102. Thus, a side surface portion of the base electrode polysilicon film 7 corresponding the inner wall of the first opening 101 projects horizontally from the side surface portion of the silicon oxide film 6 corresponding to the inner wall of the second opening 102.

The base electrode polysilicon film 7 is covered with a silicon nitride film 8. On the inner wall of the first opening 101, there is an insulating side wall spacer formed by depositing a silicon oxide film 9 and a silicon nitride film 10 in this order. A p+ type single crystal silicon intrinsic base 11 exists on the collector epitaxial silicon layer 3 inside the second opening 102. A pt type polysilicon film 12 is formed on the lower part of the side surface portion of the base electrode polysilicon film 7 (namely, on a part not covered with the side wall of the silicon oxide film 9). The p+ type polysilicon film 12 connects the base electrode polysilicon film 7 and the p+ type single crystal silicon intrinsic base 11 to each other. In the middle and surface area in the intrinsic base 11 there is an n++ type single crystal silicon emitter region 15.

A silicon oxide film 13 is also formed as the side wall spacer of the opening 101. In an area which is in the collector epitaxial silicon layer 3 and between the base 11 and the n+ type buried layer 2a, there is an n type silicon collector region 14 doped with impurities in a higher concentration than the concentration of impurities in the original collector epitaxial silicon layer 3. On the n++ type single crystal silicon emitter region 15 of a single crystal silicon there is an n++ type emitter electrode polysilicon 16. These structures are all covered with a silicon oxide film 17.

Contact holes 103a, 103b and 103c which penetrate the silicon oxide film 17 and, depending upon places, penetrate also the silicon nitride film 8 and the silicon oxide film 6 are formed. Also, a metal film of aluminum-based alloy and the like is formed so as to fill these contact holes 103a, 103b and 103c and is patterned to form an emitter electrode 18a, a base electrode 18b and a collector electrode 18c. These emitter electrode 18a, base electrode 18b and collector electrode 18c of aluminum-based alloy are respectively in contact with the emitter electrode polysilicon 16, the base electrode polysilicon layer 7 and the collector lead-out region 5.

A method for manufacturing the semiconductor device of the above-mentioned first embodiment is described with reference to FIGS. 2A, 2B, 3A, 3B, 4A–4C, 5A–5C, 6A, 6B and 7 in the following.

Figure 2A:
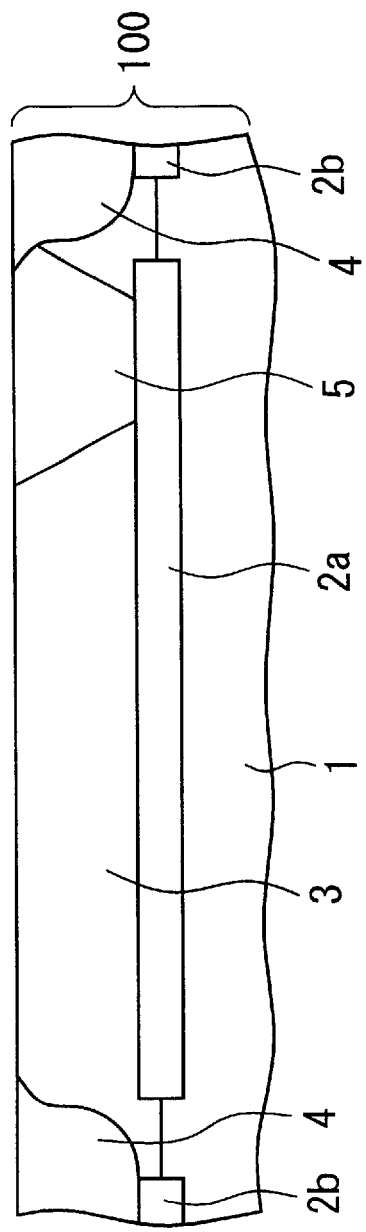
FIGS. 2A and 2B are vertical cross sectional views each showing a structure obtained during a process for manufacturing the semiconductor device of the first embodiment.

FIG. 2A is a vertical cross sectional view of the basic body 100. First, a description will be made on a method of manufacturing the basic body 100. A p– type silicon substrate 1 which has a surface of (100) plane and has a resistivity of about 10 to 20 Ωcm is prepared. An n+ type buried layer 2a and a p+ type buried layer 2b are formed in areas near the surface of the silicon substrate 1. A method for forming them is as follows.

First, a silicon oxide film (not illustrated) is formed on the silicon substrate 1 by means of an ordinary CVD method or a thermal oxidation method. The thickness of the silicon oxide film is several hundreds nm (300 to 700 nm is preferable, and the following description will be done by taking 500 nm as an example). After the silicon oxide film has been formed, a patterned photoresist film is formed on the silicon oxide film by means of an ordinary photolithography method.

The silicon oxide film which is formed on the silicon substrate 1 and which has a thickness of 500 nm is selectively removed by an ordinary wet etching method by using a hydrogen fluoride (HF)-based solution and by using this patterned photoresist as a mask material. Following this, the photoresist is removed by means of an organic solution and then the surface of the silicon substrate inside an opening of the silicon oxide film is oxidized to a depth of 20 to 50 nm for the purpose of alignment in the photolithography process, and after this, arsenic is selectively introduced into a region of the silicon substrate having a thin silicon oxide film by ion implantation of arsenic.

The acceleration energy of ion implantation needs to be so low as not to penetrate the silicon oxide film which becomes a mask material. Also, as the amount of impurities to be ion-implanted, a condition is suitable in that the concentration of impurities in the buried layer reaches the level of $1 \times 10^{19}$ cm$^{-3}$, and an acceleration energy of 70 keV and a dose of $5 \times 10^{15}$ cm$^{-2}$ were adopted (as the implantation condition, for example, an acceleration energy of 50 to 120 keV and a dose of $1 \times 10^{15}$ to $2 \times 10^{16}$ cm$^{-2}$ are suitable). Next, the substrate is heat treated at a temperature of 1,000 to 1,150 degrees Celsius for the purpose of recovering damage caused by the ion implantation, and activation and driving-in of arsenic (here, a heat treatment was performed at 1,100 degrees Celsius for 2 hours in an atmosphere of nitrogen). In such a way an n+ type buried layer 2a is formed.

The silicon oxide film of 500 nm in thickness is all removed by an HF-based solution, and a silicon oxide film of, for example, 100 nm in thickness is formed on the substrate 1 by oxidation (as the thickness, 50 to 250 nm is suitable). Also, patterning of a photoresist, ion implantation of boron (under a condition of 50 keV in energy and $1\times10^{14}$ $cm^{-2}$ in dose), removal of the photoresist, a heat treatment for activation (at 1,000 degrees Celsius for 1 hour in an atmosphere of nitrogen) and the like are performed, and thereby a channel stopper p+ type buried layer 2b is formed.

Next, the silicon oxide film is removed from all over the surface and then an n− type silicon epitaxial layer 3 is formed on whole area of the substrate 1 by an ordinary method, for example, a CVD method. A temperature of 950 to 1050 degrees Celsius is suitable as a growth temperature, and $SiH_4$ or $SiH_2Cl_2$ is used as a material gas and $PH_3$ is used as a doping gas. It is suitable that the n− type silicon epitaxial layer 3 contains impurities, that is, phosphorus, of $5\times10^{15}$ to $5\times10^{16}$ $cm^{-3}$ in concentration and is 0.3 to 1.3 $\mu$m in thickness. In this case, the thickness of the portion of the epitaxial layer 3 where the impurity concentration is equal to or less than $5\times10^{16}$ $cm^{-3}$ was about 0.6 $\mu$m. In such a way, an n− type silicon epitaxial layer 3 is formed on the buried layers 2a and 2b and on the area of the silicon substrate 1 where these buried layers 2a and 2b do not exist.

Next, a LOCOS oxide film 4 for element isolation is formed. A method of forming it is as follows. First, on the surface of the epitaxial layer 3 a thermal oxide film of 20 to 50 nm in thickness (not illustrated) is formed and then a silicon nitride film of 70 to 150 nm in thickness (not illustrated) is formed on the thermal oxide film.

Subsequently, photoresist (not illustrated) is deposited and the photoresist is patterned by photolithography. The silicon nitride film and the thermal oxide film are selectively removed by a dry etching process using the patterned photoresist as a mask.

Following this, the silicon epitaxial layer 3 is also etched and a groove or trench is formed in the surface of the silicon epitaxial layer 3. The depth of the groove (depth of etched silicon) is suitably about half the thickness of an oxide film formed by a LOCOS method.

After the photoresist has been removed, the work piece is oxidized in a condition where an element area is protected by the silicon nitride film, and thereby a silicon oxide film for element isolation, namely, a LOCOS oxide film 4 is formed.

The LOCOS oxide film has suitably a thickness reaching the buried layer 2b for a channel stopper, for example, a thickness of 300 to 1,300 nm. In this case the thickness was about 600 nm. The silicon nitride film is removed by a heated phosphoric acid.

Next, an n+ type collector lead-out region 5 is formed in order to reduce a collector resistance. A method for doing this is to dope phosphorus into this region by means of a diffusion or ion implantation method. That is to say, a photoresist film which is opened only in the collector lead-out region is formed by photolithography and phosphorus is ion-implanted at a condition of 100 keV in acceleration energy and $5\times10^{15}$ $cm^{-2}$ in dose via the opening of the photoresist film.

After the photoresist film has been removed, the whole work piece is heat treated at 1,000 degrees Celsius for 30 minutes in an atmosphere of nitrogen, in order to activate the implanted phosphorus and recover damage caused by the ion implantation.

In such a way as described above, a silicon basic body 100 shown in FIG. 2B is formed. It should be noted that the silicon basic body 100 can be manufactured by using any various method other than the method mentioned above. Also, it is possible to consider the silicon basic body as a substrate. Further, because of the existence of the n− type epitaxial silicon layer 3, it is possible to consider the silicon basic body 100 as an n− type substrate.

Figure 2B:
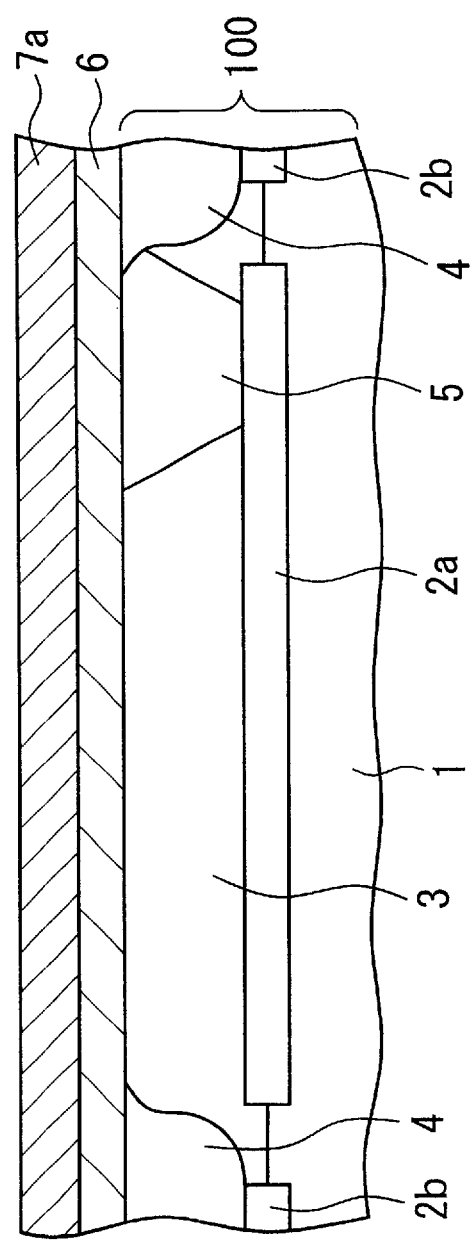

Next, as shown in FIG. 2B, the surface of this silicon basic body 100 is covered with a silicon oxide film 6. The thickness of the silicon oxide film 6 may be approximately the same degree as the thickness of an intrinsic base. However, it is preferable that the thickness of the film is somewhat thinner than the thickness of the intrinsic base, and in this case it was 50 nm.

Next, as shown in FIG. 2B, a polysilicon film 7a is deposited on the silicon oxide film 6. The polysilicon film is suitably 150 to 350 nm in thickness, and in this case it was 250 nm in thickness. Boron ion is implanted into this polysilicon film 7a. The energy of ion implantation needs to be so low that the boron ion does not penetrate through the polysilicon film 7a, and the dose of impurities needs to be so high in concentration that the concentration of impurities becomes about $1\times10^{20}$ $cm^{-3}$. In this case the implantation energy was 10 keV and the dose was $1\times10^{16}$ $cm^{-2}$. Thereby, the structure of FIG. 2B is completed.

Figure 3A:
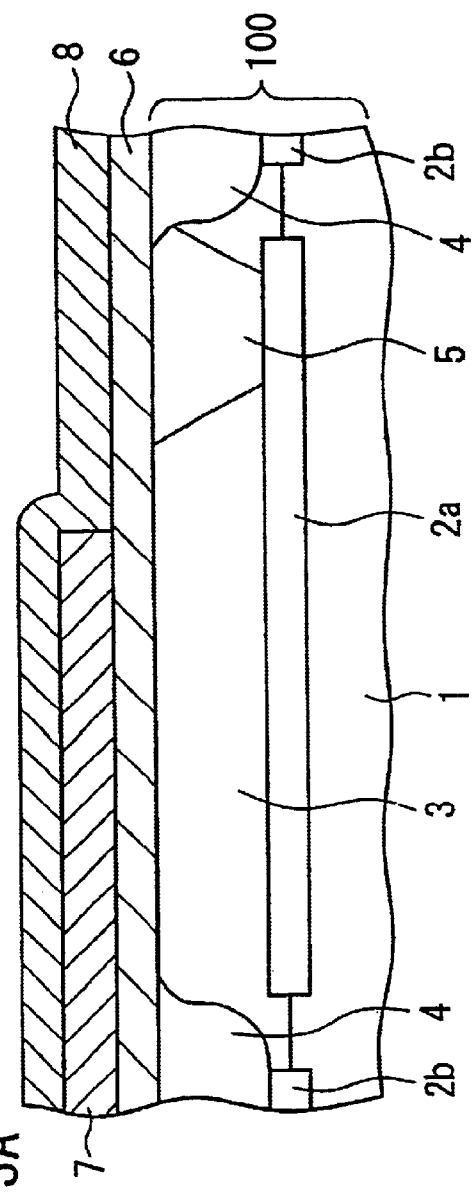
FIGS. 3A and 3B are vertical cross sectional views each showing a structure obtained, after the structure of FIG. 2B, during a process for manufacturing the semiconductor device of the first embodiment.

Next, photoresist not shown in the drawing is deposited on the polysilicon film 7a and is patterned. Then, the polysilicon film 7a is selectively removed by dry etching by using the patterned photoresist as a mask. In such a way, as shown in FIG. 3A, a p+ type base electrode polysilicon film 7 comprising the patterned polysilicon film 7a is formed.

Figure 3B:
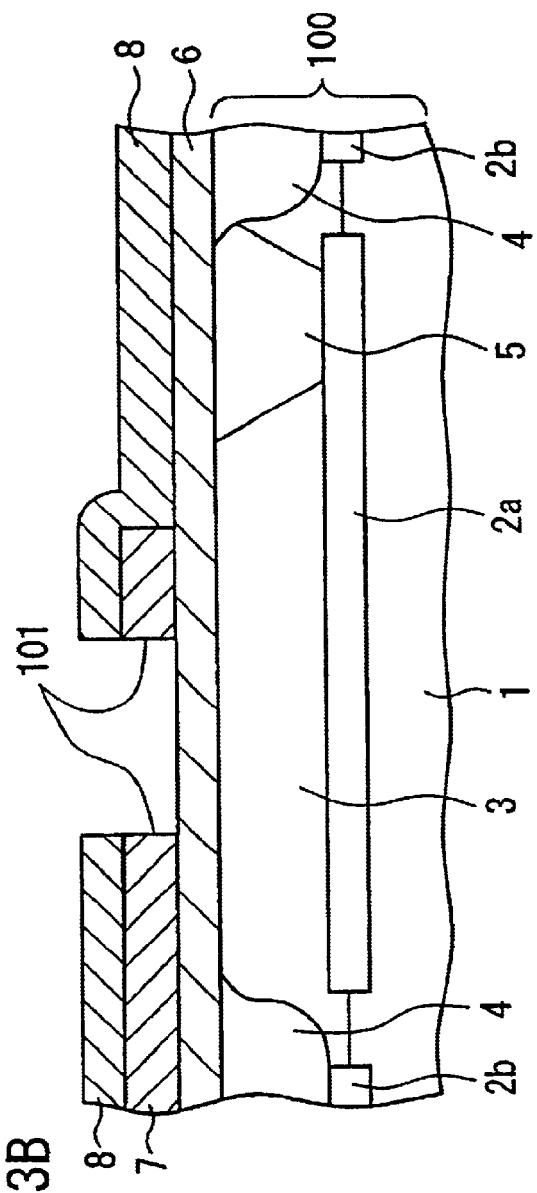

Thereafter, as shown in FIG. 3B, a silicon nitride film 8 is formed on all over the surface including the base electrode polysilicon film 7 and the silicon nitride film 8 and the polysilicon film 7 are patterned for forming an opening 101 by means of photolithography and the like. The method of doing this is as follows. First, a silicon nitride film 8 is deposited by an LPCVD (low pressure chemical vapor deposition) method to approximately 300 nm in thickness on the silicon oxide film 6 and the polysilicon film 7 (the silicon nitride film is suitably 100 to 500 nm in thickness). Next, after photoresist is deposited on the silicon nitride film 8, an opening is formed in a portion of the photoresist where an intrinsic base is formed in the future by means of an ordinary photolithography. Subsequently, the silicon nitride film 8 and the base electrode polysilicon film 7 are successively removed selectively by an an isotropic dry etching process using this photoresist as a mask. Hereupon, an opening formed in the base electrode polysilicon film 7 is set as a first opening 101. The photoresist used as a mask is removed and the structure of FIG. 3B is completed.

Figure 4A:
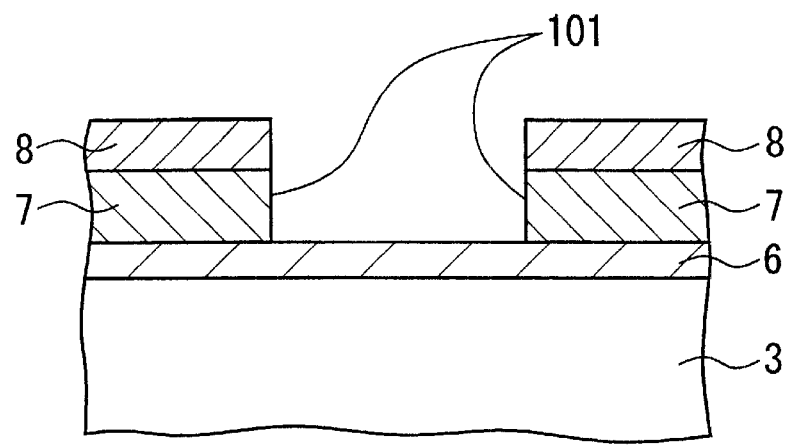
FIGS. 4A, 4B and 4C are vertical cross sectional views each showing a partial structure obtained, after the structure of FIG. 3B, during a process for manufacturing the semiconductor device of the first embodiment.

Subsequently, the manufacturing process of a structure characteristic of the present embodiment is described with reference to FIGS. 4A to 4C, 6A to 5C, 6A and 6B in the following. FIGS. 4A to 4C, 5A to 5C, 6A and 6B are partial enlarged views of an area around the opening 101, and FIG. 4A and FIG. 3B show the structures at the same process step.

Figure 4B:
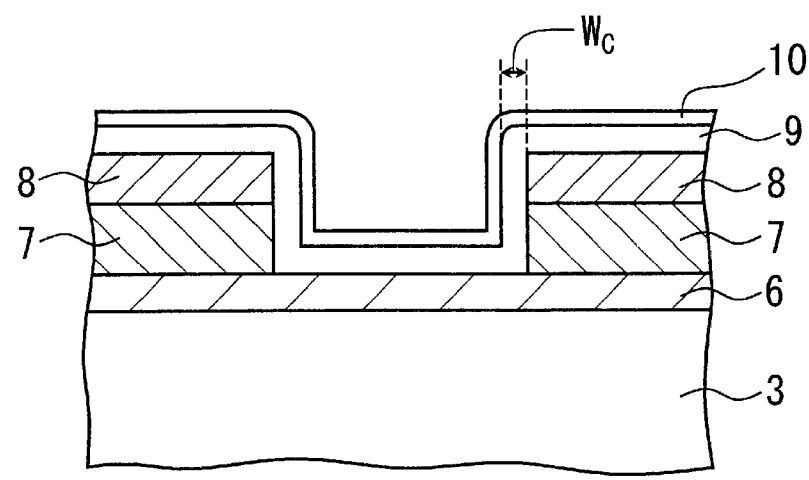

As shown in FIG. 4B, a silicon oxide film 9 is formed all over the surface of a wafer by means of an LPCVD method. The thickness $W_C$ of this silicon oxide film 9 is not less than the maximum thickness $W_F$ within a range of dispersion of the thickness $W_E$ of a polycrystalline layer 12 grown on the side surface of the base electrode polysilicon film 7 at the same time as when epitaxial-growing an intrinsic base 11 mentioned later. In this case, the thickness $W_C$ of the silicon oxide film 9 was about 50 nm. Subsequently, a silicon nitride film 10 is formed by means of the LPCVD method on the silicon oxide film 9. The silicon nitride film 10 was 80 nm in thickness.

Figure 4C:
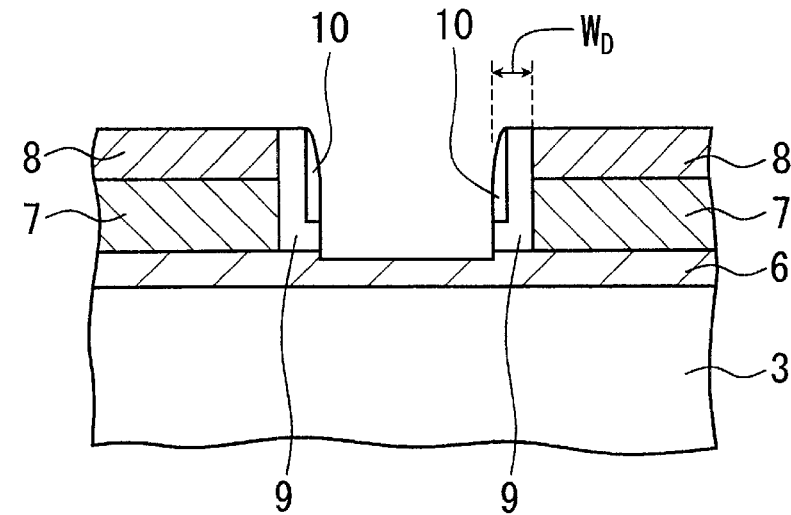

After this, as shown in FIG. 4C, the silicon nitride film 10 and the silicon oxide film 9 are etched back by an an isotropic dry etching process, and the silicon oxide film 6 is partially exposed. Hereupon, a side wall spacer comprising the remaining silicon nitride film 10 and the silicon oxide film 9 is left on the inner wall of the opening 101. The thickness $W_D$ of the side wall spacer composed of the silicon nitride film 10 and the silicon oxide film 9 left on the side surface of the opening 101 is naturally thicker than the thickness of the silicon oxide film 9 of approximately 50 nm in thickness. That is to say, the thickness $W_D$ of the side wall spacer is larger than the maximum thickness $W_F$ within a range of dispersion of the thickness $W_E$ of the polycrystalline layer 12 grown on the side surface of the base electrode polysilicon film 7 at the same time as when epitaxial-growing an intrinsic base 11 described later.

Figure 5A:
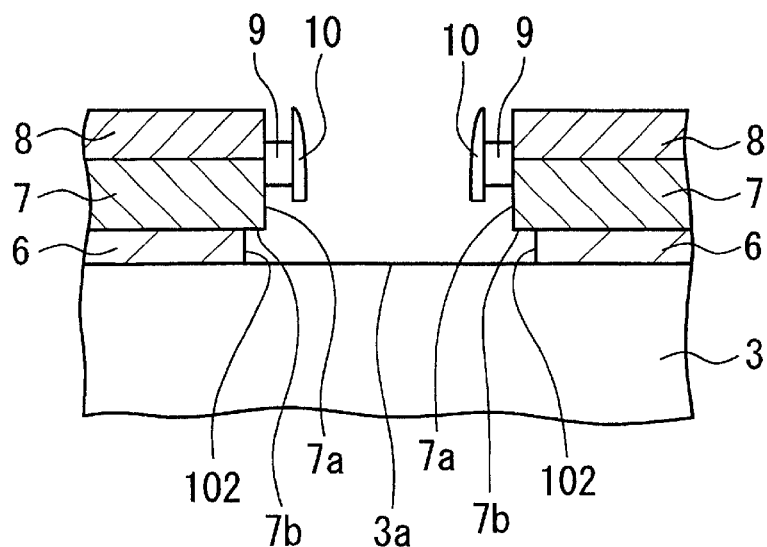
FIGS. 5A, 5B and 5C are vertical cross sectional views each showing a partial structure obtained, after the structure of FIG. 4C, during a process for manufacturing the semiconductor device of the first embodiment.

Furthermore, as shown in FIG. 5A, the silicon oxide film 6 is etched by an HF-based solution and the collector epitaxial silicon layer 3 is partially exposed. At the same time, the silicon oxide film 9 is also partially etched and the lower portion 7a of the side surface of the base electrode polysilicon film 7 is exposed. Since the etching of the silicon oxide film 6 also propagates laterally, the end surface of the silicon oxide film 6 retreats laterally from the end surface of the base electrode polysilicon film 7 (namely, from the side wall of the first opening 101). The end surface of this silicon oxide film 6 makes the side wall of the above-mentioned second opening 102. Thereby, a portion 7b of the lower surface in the proximity of the end surface of the base electrode polysilicon film 7 is also exposed.

Figure 5B:
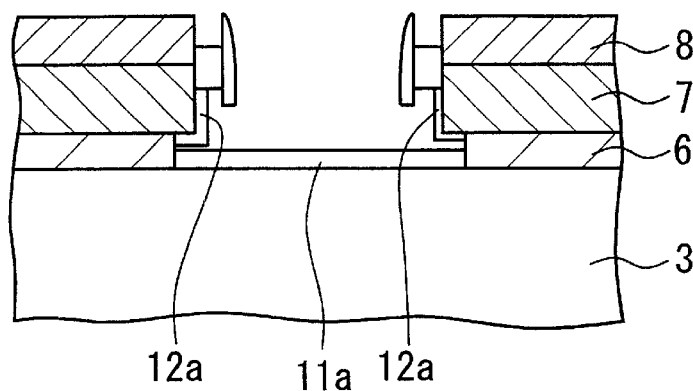

Next, an intrinsic base is formed by means of a selective crystal growth method. FIG. 5B is a vertical cross sectional view of the work piece in a middle stage of forming an intrinsic base by means of a selective crystal growth method.

An LPCVD method, a gas source MBE method and the like can be used as a growth method, but here a UHV (Ultra High Vacuum)/CVD method is described as an example. As an example of a condition, a substrate temperature of 605 degrees Celsius is used, an $Si_2H_6$ having a flow rate of 3 sccm is used as material gas, and a small amount of $B_2H_6$ is used as a doping gas. In this condition, silicon doped with boron in a low concentration is selectively grown. At this time, a p type polysilicon film 12a is grown from the exposed portion 7a of the side surface and the exposed portion 7b of the lower surface of the base electrode polysilicon film 7. On the other hand, a base region 11a composed of a p type single crystal silicon is grown on an exposed portion 3a of the silicon collector layer 3.

Figure 5C:
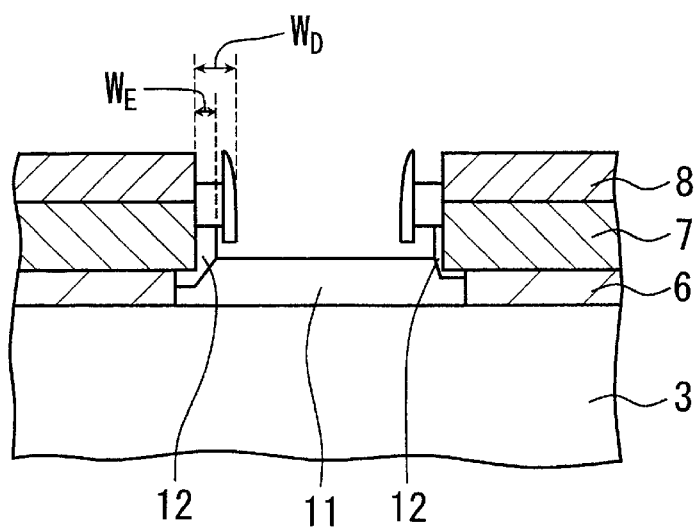

FIG. 5C is a cross sectional view of the work piece in a stage where an intrinsic base 11 and a p+ type polysilicon film 12 connecting the intrinsic base 11 to the base electrode polysilicon film 7 have been formed by means of a selective crystal growth method.

The p type polysilicon film 12 grown from the exposed portion 7a of the side surface and the exposed portion 7b of the lower surface of the base electrode polysilicon film 7 and the base region 11 composed of a p type single crystal silicon grown from the exposed portion 3a of the silicon collector layer 3 are connected to each other as a result of the growth of them.

The concentration of boron as impurities in the polysilicon film 12 and the base region 11 is, for example, $5 \times 10^{18}$ $cm^{-3}$, and the film thickness of the intrinsic base 11 is 60 nm for example. On the other hand, since the p+ type polysilicon film 12 grows from the surface of polycrystal, the thickness $W_E$ of the p+ type polysilicon film 12 disperses. The average film thickness of the p+ type polysilicon films 12 is, for example, 40 nm and the maximum thickness $W_F$ within a range of dispersion is 50 nm.

Figure 6A:
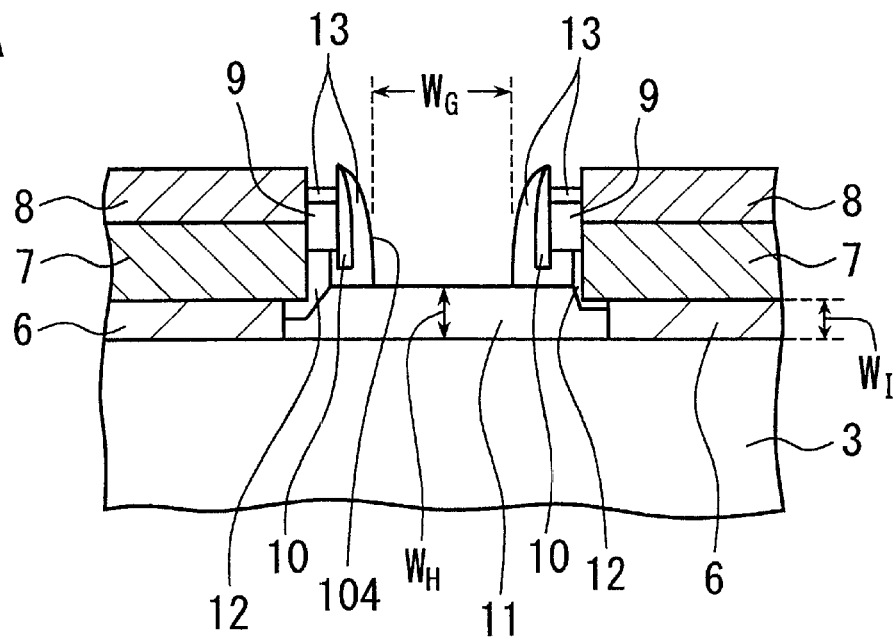
FIGS. 6A and 6B are vertical cross sectional views each showing a partial structure obtained, after the structure of FIG. 5C, during a process for manufacturing the semiconductor device of the first embodiment.

After this, a silicon oxide film of 100 nm in thickness is formed on whole surface of the substrate including the p+ type single crystal silicon intrinsic base region 11 by means of an LPCVD method. Following this, the silicon oxide film is etched back by means of an an isotropic dry etching process. Thereby, as shown in FIG. 6A, a silicon oxide film spacer 13 of approximately 100 nm in thickness is formed as the side wall inside the opening 101.

Figure 6B:
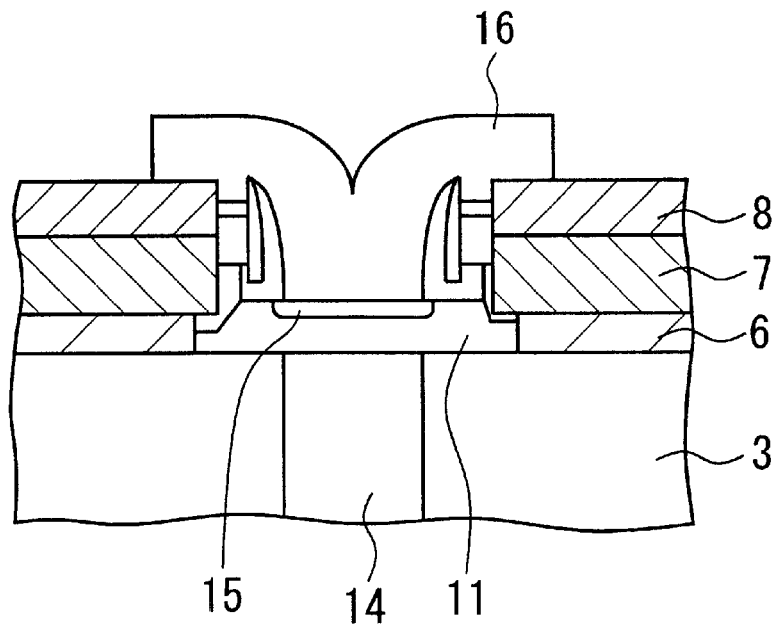

Next, as shown in FIG. 6B, an n type collector region 14 is formed in the collector epitaxial silicon layer 3 directly under the intrinsic base 11 by ion implantation of phosphorus. The condition of phosphorus ion implantation was 200 keV in acceleration energy and $4 \times 10^{12}$ $cm^{-2}$ dose as an example.

Figure 7:
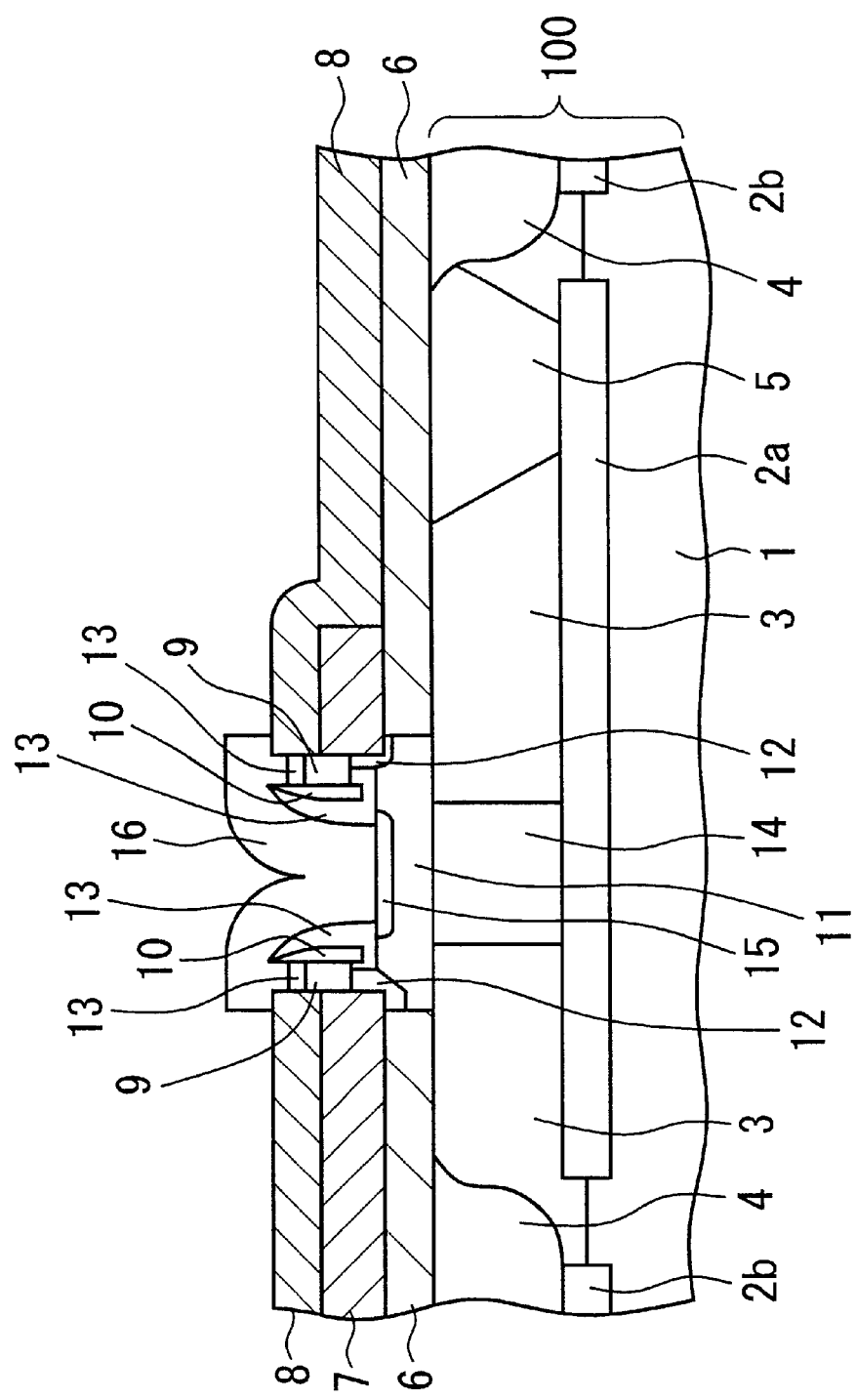
FIG. 7 is a vertical cross sectional view showing an overall structure of a semiconductor device including the portion corresponding to the structure shown in FIG. 6B, obtained during a process for manufacturing the semiconductor device of the first embodiment.

Subsequently, a phosphorus-doped polysilicon film of about 250 nm in thickness is deposited on whole surface of the substrate by means of the LPCVD method. Then, the polysilicon film is patterned by the photolithography and the an isotropic dry etching. In this way, as shown in FIG. 6B, an n+ type emitter electrode polysilicon film 16 is formed. An n++ type single crystal silicon emitter region 15 is formed by diffusion of impurities contained in the n+ type emitter electrode polysilicon film 16 into the area around the surface of the intrinsic base 11. Thereby, a structure shown in FIG. 6B is completed. Also, FIG. 7 is a vertical cross sectional view showing a whole semiconductor device at the stage of FIG. 6B.

Following this, the whole wafer is covered with a silicon oxide film 17. Moreover, openings 103a, 103b and 103c reaching respectively the emitter electrode polysilicon film 16, the base electrode polysilicon film 7 and the collector lead-out region 5 are formed by means of the photolithography and the an isotropic dry etching process as openings for forming metal electrodes.

After the photoresist has been removed, aluminum alloy film is formed on whole surface of the substrate by sputtering and patterned by photolithography and dry etching. Thereby, an emitter aluminum alloy electrode 18a, a base aluminum alloy electrode 18b and a collector aluminum alloy electrode 18c are formed. In this way, a semiconductor device of FIG. 1 is fabricated.

Figure 8A:
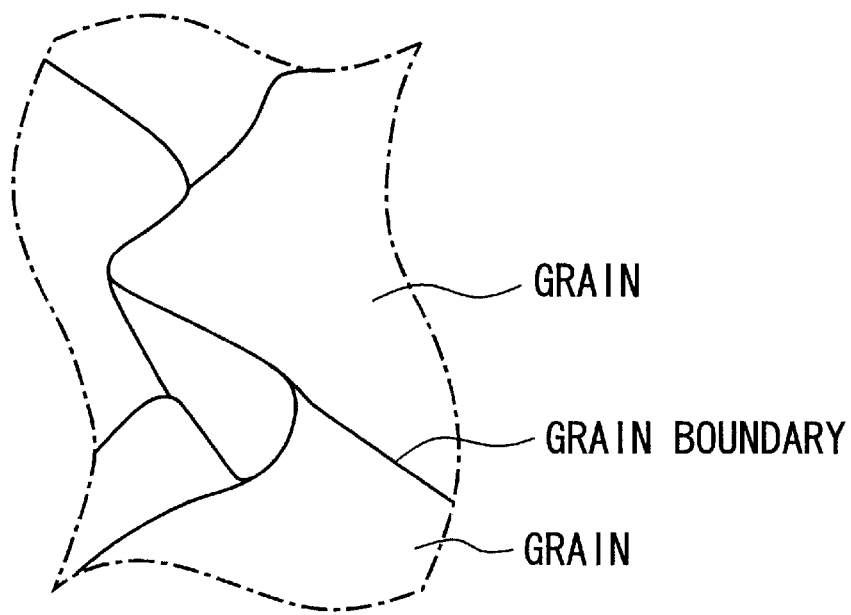
FIGS. 8A and 8B are schematic views each illustrating grain boundaries of polysilicon.
Figure 8B:
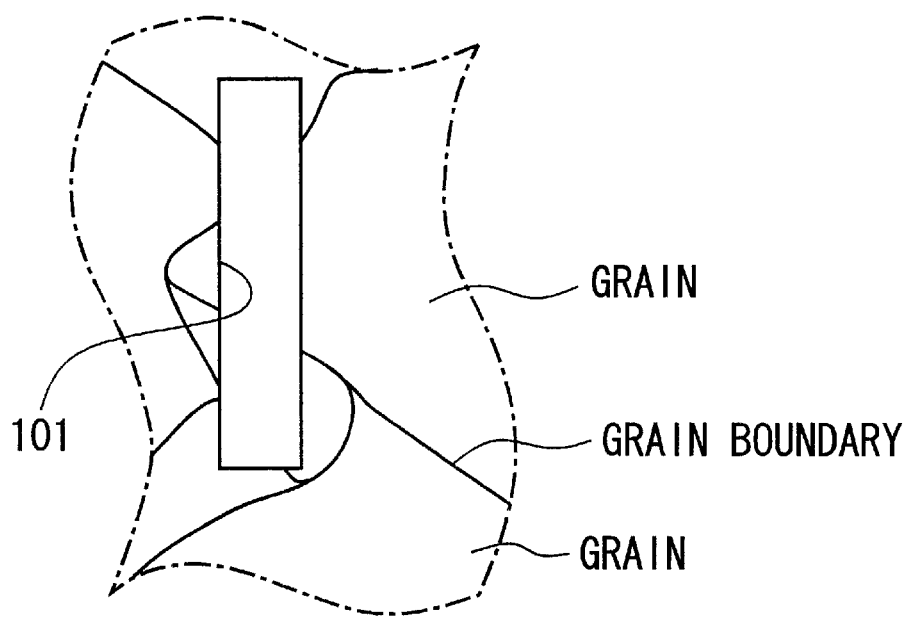

Hereupon, reference to FIGS. 8A and 8B is made. FIG. 8A is an enlarged partial plan view which schematically illustrates grains and grain boundaries at the upper surface of a base electrode polysilicon film 7 before forming the opening 101. FIG. 8B is an enlarged partial plan view showing the relation in position of the opening 101 to the grains and grain boundaries flatly shown in FIG. 8A.

As can be understood from FIG. 8B, the opening 101 is disposed so that its inner wall surface cuts across some grain boundaries. Direction of crystal lattice planes can differ in different grains. Therefore, direction of crystal lattice planes at the inner wall is not uniform. Due to this, the thickness $W_D$ of the p type polysilicon film 12 grown from the exposed portion 7a of the side surface and the exposed portion 7b of the lower surface of the base electrode polysilicon 7 is influenced by the directions of crystal lattice planes of the grains appearing at the exposed portions 7a and 7b, and disperses depending on each opening 101. In case that the openings 101 are small, dispersion of thickness $W_D$ of the p type polysilicon film 12 becomes considerably large. However, in this embodiment, as shown in FIG. 4C, by etching back the silicon nitride film 10 and the silicon oxide film 9 by means of an an isotropic dry etching process, the thickness $W_D$ of the side wall spacer composed of the silicon nitride film 10 and the silicon oxide film 9 being left on the side wall of the opening 101 can be made thicker than the maximum thickness $W_F$ within a range of variation of the thickness $W_E$ of the p type polysilicon film 12 grown from the exposed portion 7a of the side surface and the exposed portion 7b of the lower surface of the base electrode polysilicon 7 exposed in the opening 101. Thereby, the size $W_G$ of an opening 104 defined by the silicon oxide film 13 is not influenced by the dispersion of the thickness $W_E$ of the polysilicon film 12. Namely, the area in which the emitter electrode polysilicon film 16 and the p+ type single crystal silicon intrinsic base region 11 are in contact with each other, that is, the emitter size, can be made almost as designed without being influenced by the variation in thickness $W_E$ of the p type polysilicon film 12.

Next, an effect obtained by the above-mentioned constitution is described. As described above, this effect is to reduce variation in operating current of a transistor. Concretely, some numerical values are shown in the following.

In a bipolar transistor circuit, as described above, a differential transistor pair is formed by short-circuiting with each other the emitters of transistors which are adjacent to each other. It is assumed that voltages to be applied to the bases so that the collector currents of the respective transistors of this differential transistor pair are equal to each other are VB1 and VB2, respectively. The difference between these voltages, namely, the absolute value of (VB1−VB2) is defined as ΔVB.

In order to make circuit operation stable, it is advantageous that this ΔVB is as small as possible. The reason is that in case of combining some stages of differential transistor pairs, necessary input potential varies due to occurrence of changeover of the differential transistor pairs.

In the following table, the magnitudes of ΔVB (mV) in case of using the prior art and the present invention are respectively shown in Table 1 below. On a wafer, many semiconductor devices are formed, and, in Table 1, average values of 9 points of the differential pairs are shown. Design values of emitter sizes are (0.6×2.0 $\mu m^2$),(0.6×8.0 $\mu m^2$) and (0.6×16.0 $\mu m^2$).

TABLE 1

| | magnitude of ΔVB (mV) | |
| --- | --- | --- |
| | Prior art | Present invention |
| 0.6 × 2.0 $\mu m^2$ | 12.3 mV | 0.7 mV |
| 0.6 × 8.0 $\mu m^2$ | 7.8 mV | 0.8 mV |
| 0.6 × 16.0 $\mu m^2$ | 4.5 mV | 0.6 mV |

It can be seen that dispersion becomes slightly smaller when, in the transistors of the prior art, design values of emitter size become larger. The reason for this is considered to be as follows. The larger the emitter size, the number of grains at the side surface of the polysilicon film 7 exposed by the opening 301 is increased. Thereby, the growth rate of the p+ type polysilicon film 212 is averaged and the dispersion of the thickness $W_A$ of the p+ type polysilicon film 212 is also decreased. Thus, it is considered that, in the transistors of the prior art, ΔVB becomes slightly smaller, when the designed size of the emitter is large.

Also, the thickness $W_H$ (=60 nm) of the intrinsic base single crystal film 11 formed by a selective crystal growth method is thicker than the spacing $W_I$ between the upper surface of the collector epitaxial silicon layer 3 and the lower surface of the base electrode polysilicon film 7, namely, the thickness (=50 nm) of the silicon oxide film 6 ($W_H > W_I$). Further, since the intrinsic base single crystal film 11 is formed by the growth of single crystal, the thickness $W_H$ hardly disperses. The intrinsic base 11 and the base electrode polysilicon film 7 can be connected to each other only by the growth of single crystal and, therefore, it becomes possible to reliably and surely connect the intrinsic base 11 and the base electrode polysilicon film 7.

Moreover, the relation among $W_H$, $W_I$ and the thickness $W_c$ (=50 nm) of an insulating film, namely, the silicon oxide film 9 which first covers the side surface of the base electrode polysilicon film 7 etched at the same time as when partially exposing the surface of the collector epitaxial silicon layer 3 by etching the silicon oxide film 6 just before the selective crystal growth is represented by the following expression:

$$W_I < W_H < W_I + W_C.$$

Therefore, the intrinsic base single crystal film 11 is not directly in contact with the silicon nitride film 10. As a result, it is possible to easily and surely prevent the increase in a leak current caused when the intrinsic base single crystal film 11 directly comes into contact with the silicon nitride film 10.

Second Embodiment
(SiGe Base)

Figure 9A:
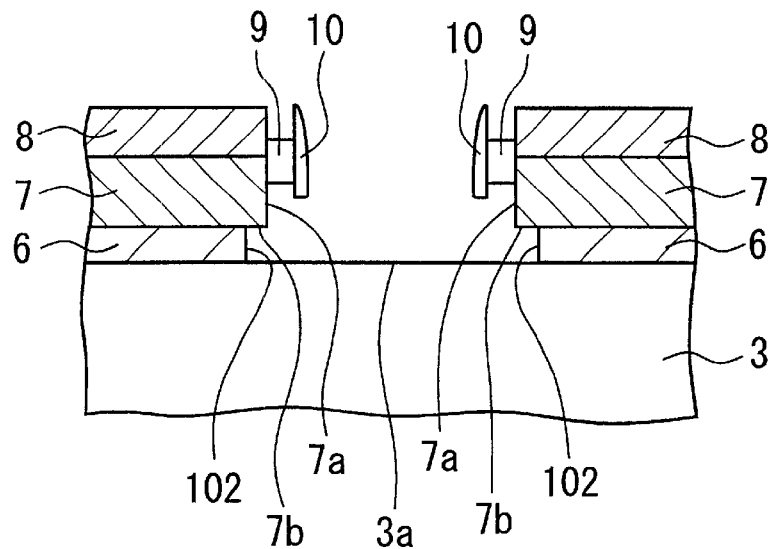
FIGS. 9A, 9B and 9C are vertical cross sectional views each showing a partial structure obtained during a process for manufacturing the semiconductor device of a second embodiment.
Figure 9B:
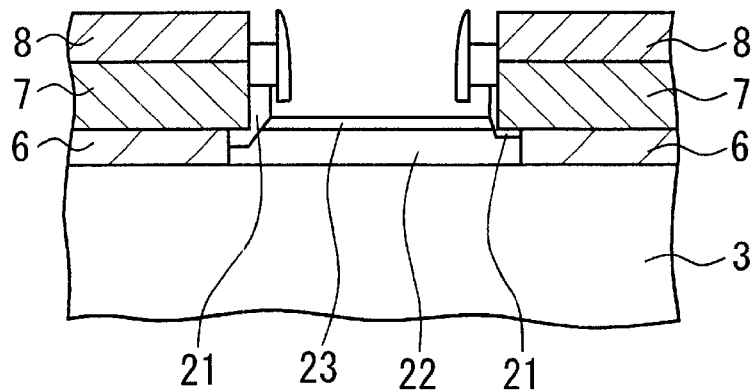
Figure 9C:
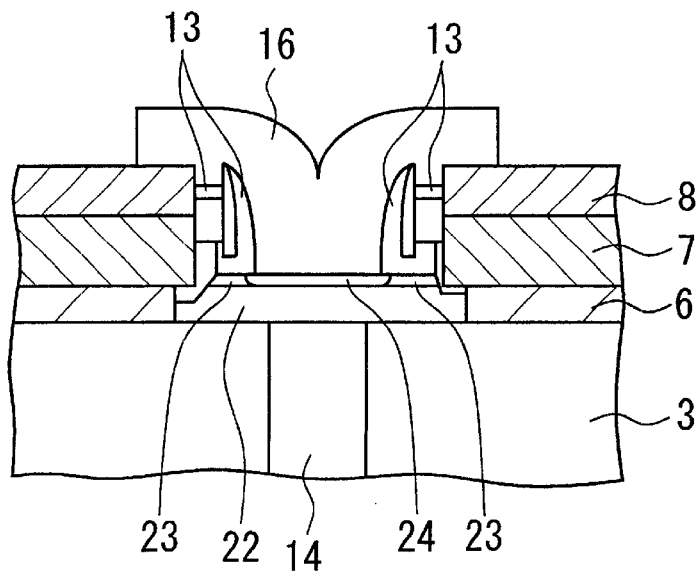

Next, a second embodiment of the present invention will be described. Since the second embodiment is the same as the first embodiment except that its base is composed of an SiGe base, only processes specific to the second embodiment are described in the following. FIGS. 9A, 9B and 9C are vertical enlarged cross sectional views each showing a partial structure obtained during a process for manufacturing the semiconductor device of the second embodiment. FIGS. 9A, 9B and 9C show structures corresponding to those of FIGS. 5A, 5C and 6B in the first embodiment.

As shown in FIG. 9A, the opening 102 formed by lateral retreat of the end surface of the silicon oxide film 6 and the side wall spacer composed of the silicon nitride film 10 and the silicon oxide film 9 are formed, and process steps up to these are the same as those described with reference to FIG. 5A in the first embodiment. Thereafter, a p type polycrystalline SiGe film 21, grown from the exposed portion 7a of the side surface and the exposed portion 7b of the lower surface of the base electrode polysilicon film 7, is formed. The p type polycrystalline SiGe film 21 was formed by means of a UHV/CVD method. An example of growth conditions is a substrate temperature of 605 degrees Celsius, an $Si_2H_6$ flow rate of 3 sccm and a $GeH_4$ flow rate of 2 sccm.

On the other hand, a base region 22 composed of a p type single crystal SiGe alloy is formed on an exposed portion 3a of the silicon collector layer 3. These polycrystalline SiGe alloy film 21 and SiGe alloy base region 22 are in contact with each other.

Details of such structure and the like will be described. The intrinsic base layer is composed of two layers. First, a nondoped SiGe layer is grown on the exposed portion 3a of the silicon collector 3 inside the opening 101 by means of a selective epitaxial growth method. The concentration of Ge was about 10 percent. The thickness of the grown film is about 25 nm. It is a matter of course that it is possible to make thicker the film thickness within a range where no defect occurs by means of a heat treatment of a later process.

At this time, a nondoped polycrystalline SiGe film is grown also from the exposed portion 7a of the side surface and the exposed portion 7b of the lower surface of the p+ type polysilicon film 7 at the same time. A heat treatment is performed in order to dope boron in a high concentration into the nondoped polycrystalline SiGe film. Thereby, boron diffuses from the polysilicon film 7 into the nondoped polycrystalline SiGe film, and the nondoped polycrystalline SiGe becomes a p+ type polycrystalline SiGe film.

Next, a p+ type SiGe graded layer having a graded Ge profile is formed on the nondoped SiGe film. An example of a Ge profile of the p+ type SiGe graded layer, a concentration profile of boron as impurities and its film thickness is described. The thickness of the p+ type SiGe graded layer having a profile in which the concentration of Ge in SiGe decreases linearly from 10 percent to 0 percent as approaching to the surface is 40 nm. This layer is doped with boron of $5 \times 10^{18}$ cm$^{-3}$ in concentration. Thus, the intrinsic base layer 22 of 65 nm (=25 nm+40 nm) in thickness is formed which intrinsic base layer 22 is composed of the nondoped SiGe film having a thickness of approximately 25 nm and the p+ type SiGe graded layer having a thickness of approximately 40 nm.

FIG. 9B is a cross sectional view of the work piece in a stage where a single crystal silicon film 23 and a polycrystalline silicon layer are formed by means of a selective crystal growth method thereafter. That is to say, a layer 23 of about 30 nm in thickness purely composed of Si without containing Ge exists on the intrinsic base 22. In FIGS. 9B and 9C, the intrinsic base 22 and the polycrystalline layer 21 each properly having two-layer structure are shown as having one-layer structure for convenience.

After this, a silicon oxide film spacer 13 which is a side wall spacer is formed by using deposition of a silicon oxide film and etching back and the like. Then, a n type collector region 14 is formed by ion implantation and the like into the collector epitaxial layer 3 just under the intrinsic base 22. Further, a polysilicon film doped with phosphorus is deposited and patterned by using photolithography, etching and the like, so that, as shown in FIG. 9C, an n++ type emitter electrode polysilicon 16 is formed. Then, an n++ type single crystal silicon emitter region 24 is formed in a single crystal silicon film 23 by using heat treatment and the like. Thereby, the structure shown in FIG. 9C is completed. This structure corresponds to the structure shown in FIG. 6B in the first embodiment. Processes after this are the same as the first embodiment, and an explanation thereof is omitted here.

Third Embodiment

Figure 10:
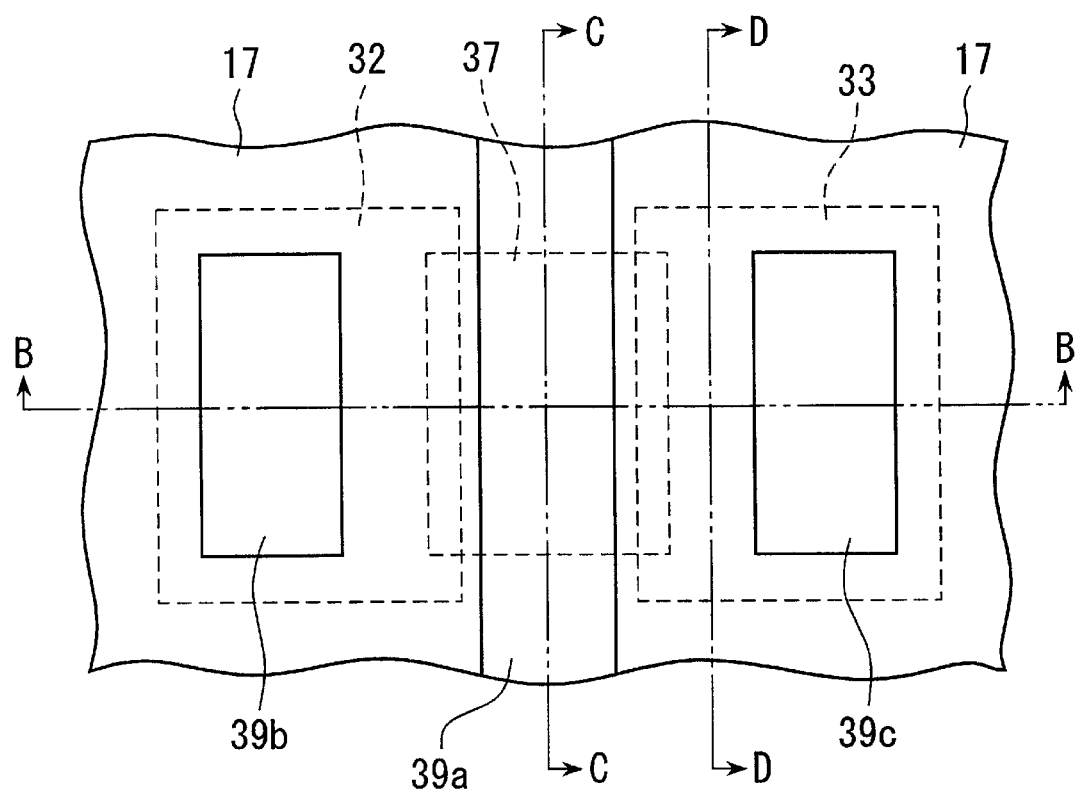
FIG. 10 is a plan view illustrating a semiconductor device of a third embodiment of the present invention.
Figure 11A:
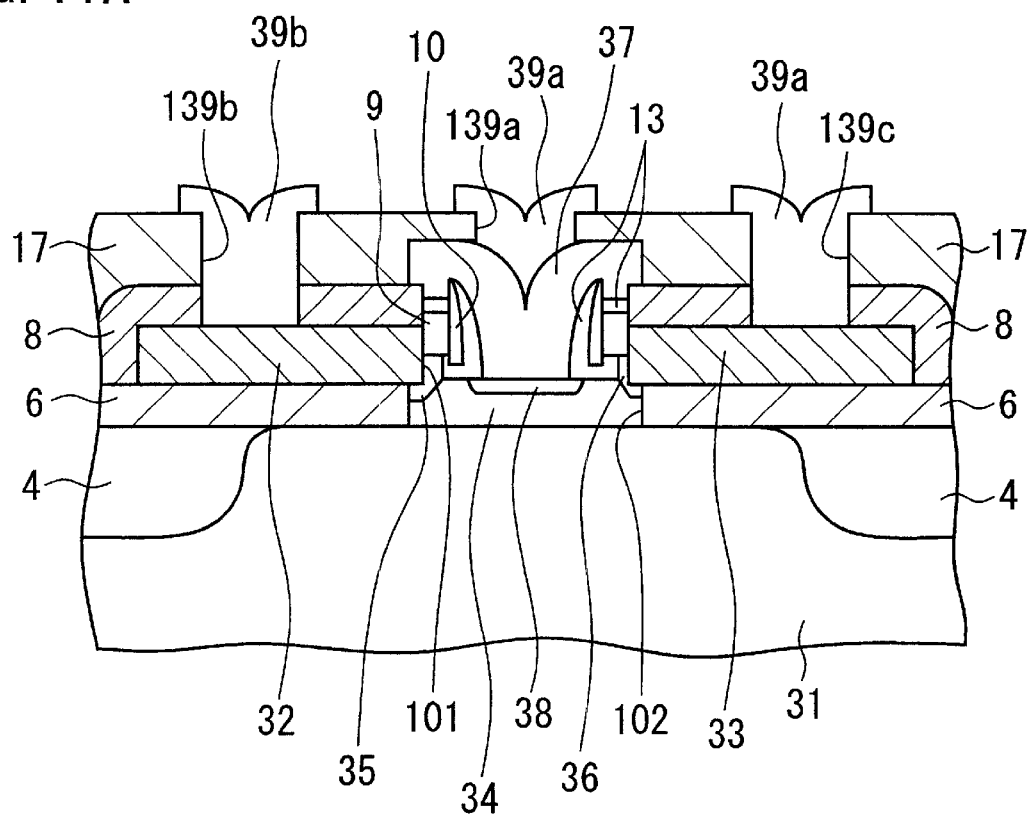
FIG. 11A is a vertical cross sectional view of the semiconductor device of the third embodiment of the present invention taken along the line B—B of FIG. 10.
Figure 11B:
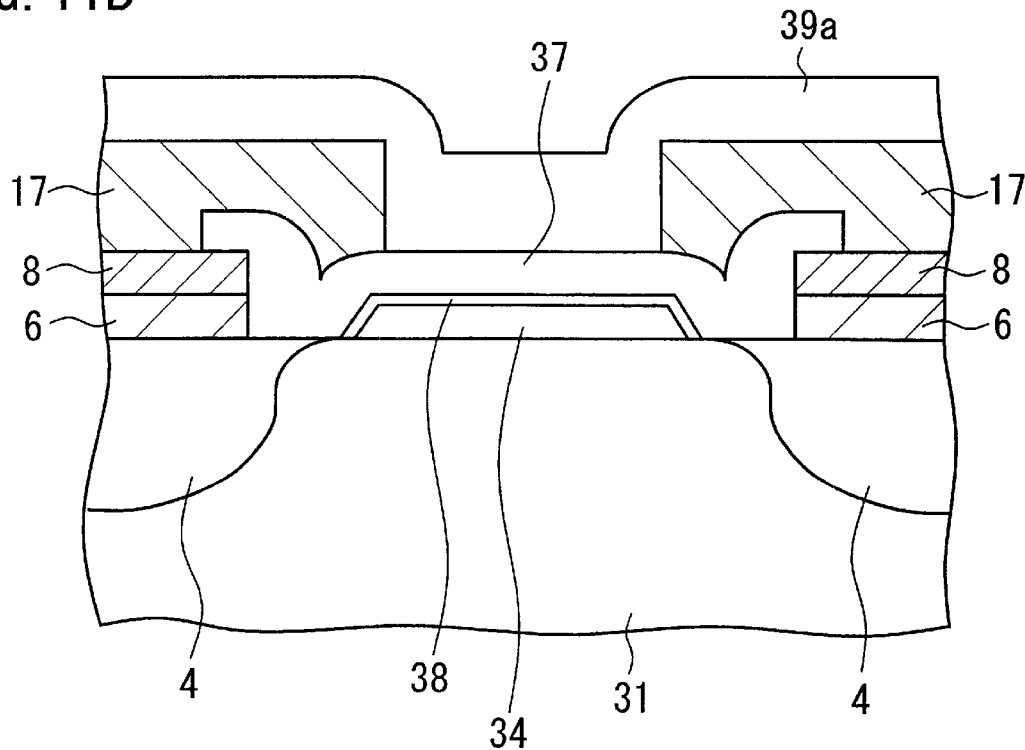
FIG. 11B is a vertical cross sectional view of the semiconductor device of the third embodiment of the present invention taken along the line C—C of FIG. 10.
Figure 12:
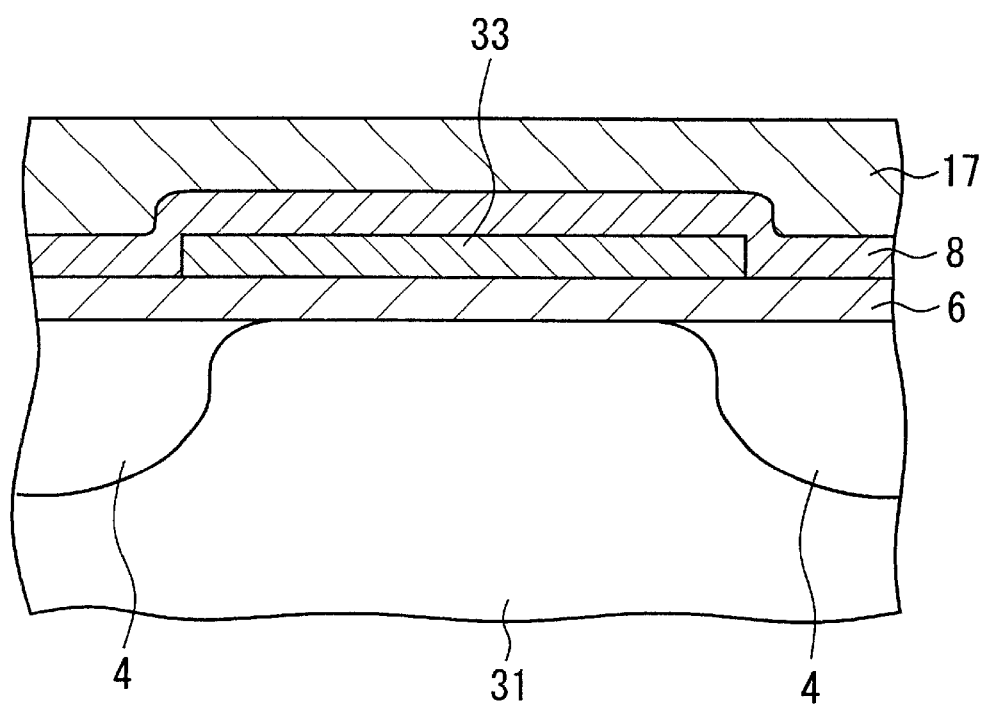
FIG. 12 is a vertical cross sectional view of the semiconductor device of the third embodiment of the present invention taken along the line D—D of FIG. 10.

Next, a third embodiment of the present invention will be described. The third embodiment relates to a junction FET. FIG. 10 is a schematic plan view of a semiconductor device of the third embodiment. FIG. 11A is a schematic vertical cross sectional view of the semiconductor device taken along line B—B of FIG. 10 and an FET current flows in the horizontal direction on the drawing sheet. FIG. 11B is a schematic vertical cross sectional view of the semiconductor device taken along line C—C of FIG. 10 and an FET current flows in the direction perpendicular to the drawing sheet. FIG. 12 is a schematic vertical cross sectional view of the semiconductor device of the third embodiment of the present invention taken along line D—D of FIG. 10 and an FET current flows in the direction perpendicular to the drawing sheet.

First, reference to FIG. 10 is made. In the third embodiment, a source electrode polysilicon film 32 and a drain electrode polysilicon film 33 are divided into two by the patterning of the gate. Since only the main surface of an n– type silicon substrate 31 inside the end of a LOCOS is exposed, a selective epitaxial growth is performed only on the element forming area.

As shown in FIG. 11A, a silicon oxide film 4 for element isolation is formed in the main surface of the n– type silicon substrate 31 by a LOCOS method. The main surface of the n– type silicon substrate 31 surrounded by the silicon oxide film 4 is exposed, thereby a device or element forming area is defined and formed. A structure formed on the main surface of the n– type silicon substrate 31 in which the silicon oxide film 4 has been formed corresponds to a structure in which the right half is also formed symmetrically to the left half with respect to the center of the intrinsic base 11 in the structure formed on the surface of the silicon basic body 100 in FIG. 1.

That is to say, first, the main surface of the silicon substrate 31 is covered with a silicon oxide film 6. It is suitable that the thickness i,of the silicon oxide film 6 is approximately the same as the thickness of a p type channel silicon film 34 described later. Next, a polysilicon film is deposited and, for example, p type impurities such as boron are ion-implanted into the polysilicon film. Moreover, photoresist is deposited on the polysilicon film and the photoresist is patterned, and then unnecessary polysilicon film is removed by dry etching process using this photoresist as a mask. Thereby, a source/drain electrode polysilicon film is formed which is to be formed into the source electrode polysilicon film 32 and the drain electrode polysilicon film 33 in the future but is not yet divided into them.

On the whole surface including the source/drain electrode polysilicon film, a:silicon nitride film 8 is formed and then a photoresist film is formed on the silicon nitride film 8. Next, an opening is formed in the photoresist film on the area in which a p type channel is to be formed in the future, by means of an ordinary photolithography. Following this, the silicon nitride film 8 and the source/drain electrode polysilicon film under this silicon nitride film 8 are successively and selectively removed by means of an an isotropic dry etching process using this photoresist as a mask. Hereupon, the opening formed in the silicon nitride film 8 and the source/drain electrode polysilicon film is set as a first opening 101 in a manner similar to the first embodiment. Also, the source/drain electrode polysilicon film is divided by the first opening 101 into the source electrode polysilicon 32 and the drain electrode polysilicon 33.

A silicon oxide film 9 is formed all over the wafer in the same way as FIG. 4B of the first embodiment and a silicon nitride film 10 is formed on the silicon oxide film 9. Next, in the same manner as FIG. 4C of the first embodiment, the silicon oxide film 6 is partially exposed by etching back the silicon nitride film 10 and the silicon oxide film 9 by means of an an isotropic dry etching process. The side wall of $W_D$ in thickness composed of the silicon nitride film 10 and the silicon oxide film 9 left as the result thereof is left on the side surface of the opening 101, in a manner similar to the first embodiment.

Furthermore, in the same manner as shown in FIG. 5A of the first embodiment, the main surface of the silicon substrate 31 is exposed partially by etching the exposed silicon oxide film 6 by means of an HF-based solution. At this time, the silicon oxide film 9 is also etched and the lower portion of the side surface of each of the source electrode polysilicon film 32 and the drain electrode polysilicon film 33 is exposed. As a result of this etching, the end surface of the silicon oxide film 6 retreats laterally from the respective end surfaces (namely, inner walls of the opening 101) of the source electrode polysilicon film 32 and the drain electrode polysilicon film 33. The end surface of this silicon oxide film 6 corresponds to the second opening 102.

Next, a p+ type channel single crystal silicon film 34, and p type polysilicon films 35 and 36 connecting the p+ type channel single crystal silicon film 34 respectively to the side surfaces of the source electrode polysilicon film 32 and the drain electrode polysilicon film 33 are formed by means of a selective crystal growth method in the same manner as shown in FIGS. 5B and 5C of the first embodiment.

After this, a silicon oxide film is formed on the surface including the p type channel silicon film 34, by using an LPCVD method. Following this, an an isotropic dry etching process is performed to etch back the silicon oxide film and in the same manner as FIG. 6A of the first embodiment, a silicon oxide film spacer 13 is formed as the side wall inside the opening 101.

Subsequently, a phosphorus-doped polysilicon is deposited by means of an LPCVD method. Furthermore, this polysilicon film is patterned by photolithography and an isotropic dry etching. In this way, as shown in FIG. 11A, an n++ type polysilicon film 37 is formed. At this time, an n++ type single crystal silicon region 38 is formed in the region in the proximity of the surface of the p type channel single crystal silicon film 34 which is in contact with the n++ type polysilicon film 37.

After this, the whole wafer is covered with a silicon oxide film 17. Furthermore, as openings for forming metal electrodes, openings 139a, 139b and 139c reaching respectively the source electrode polysilicon film 32, the gate electrode polysilicon film 37 and the drain electrode polysilicon film 33 are formed by photolithography and anisotropic dry etching.

After the photoresist has been removed, an aluminum alloy film is formed by sputtering and is patterned by means of photolithography and dry etching. Thereby, a gate aluminum alloy electrode 39a, a source aluminum alloy electrode 39b and a drain aluminum alloy electrode 39c are formed, and thereby a semiconductor device of this embodiment is fabricated.

In this third embodiment, it is possible to effectively suppress dispersion in size of the n++ type single crystal silicon region 38, similarly to the first embodiment in which dispersion in the size of the n++ type single crystal silicon emitter region 15 can be effectively suppressed. Therefore, it is possible to minimize dispersion or variation in electric characteristics of a junction FET.

Fourth Embodiment

Figure 13:
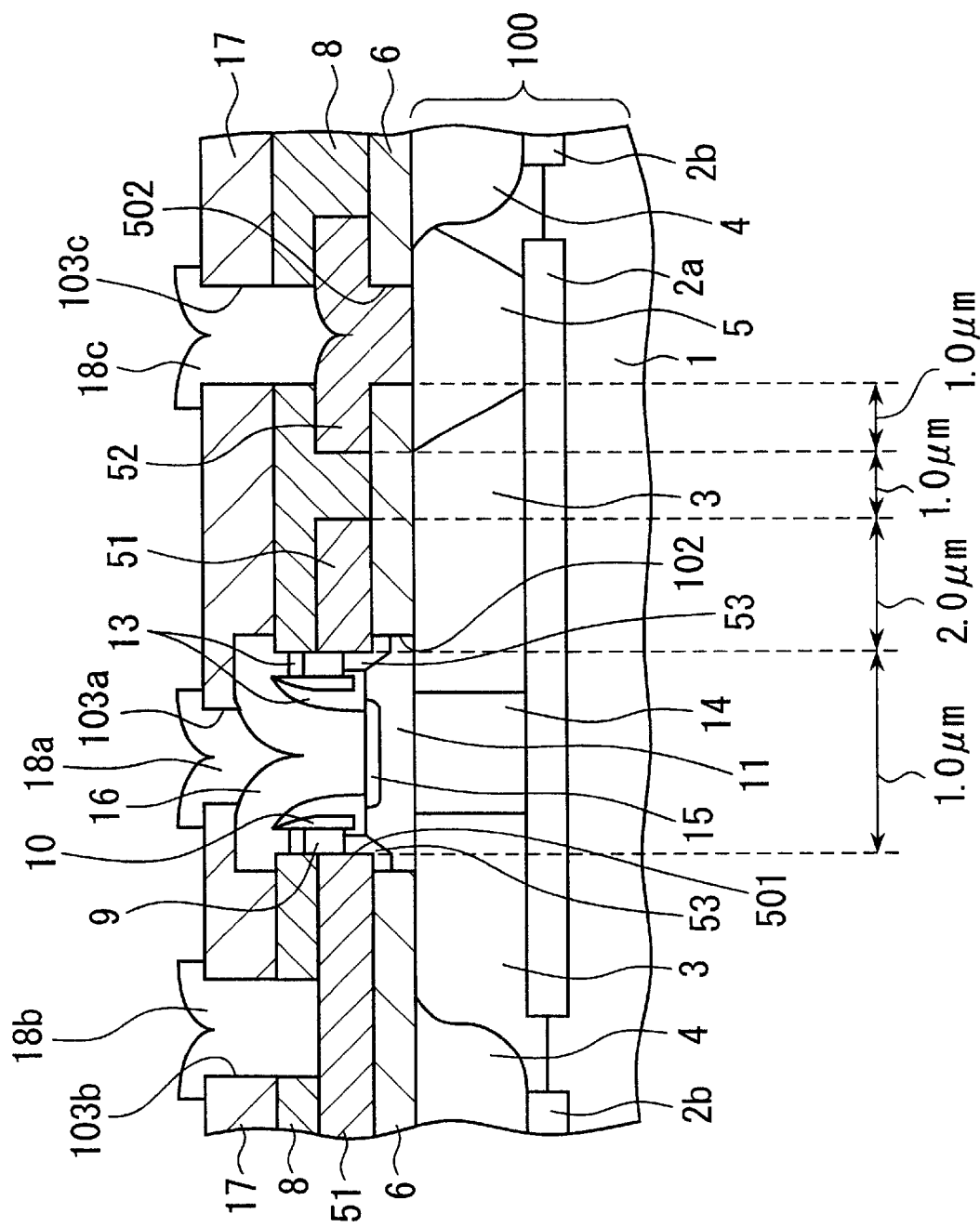
FIG. 13 is a vertical cross sectional view of a semiconductor device of a fourth embodiment of the present invention.
Figure 15:
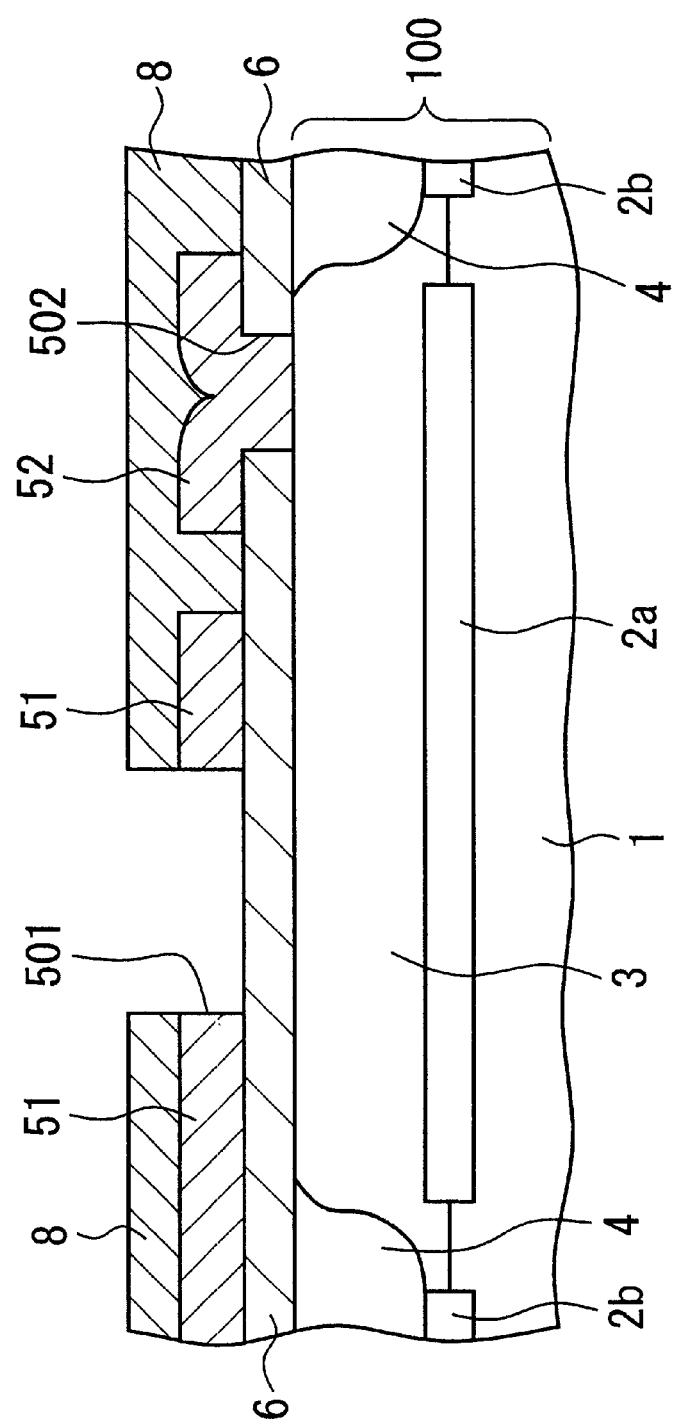
FIG. 15 is a vertical cross sectional view showing a structure obtained after the structure of FIG. 14B, during a process for manufacturing the semiconductor device of the fourth embodiment.

Next, a fourth embodiment of the present invention will be described. Since the fourth embodiment is approximately the same as the first embodiment except that the base electrode polysilicon of the semiconductor device of the first embodiment has been replaced with a single crystal silicon, only processes specific to the fourth embodiment are described in the following. FIG. 13 is a vertical cross sectional view of a semiconductor device of the fourth embodiment of the present invention, and FIGS. 14A, 14B and 15 are its vertical cross sectional views in a main process for manufacturing the semiconductor device of the fourth embodiment. In FIG. 13 and FIGS. 14A and 14B, portions corresponding to the portions shown in FIG. 1 are given the same reference numbers as those of FIG. 1 and description of them is omitted.

A method for forming a base electrode single crystal silicon film 51 which is used in place of the base electrode polysilicon film 7 of the first embodiment is described in the following.

The fourth embodiment of the present invention is approximately the same as the first embodiment until the silicon oxide film 6 is formed on the silicon basic body 100 and an explanation thereof is omitted here.

Following this, as shown in FIG. 14A, an opening 502 is formed in a portion of the silicon oxide film 6 through which a collector electrode is led out, by using photolithography, etching and the like. After this opening has been formed, an amorphous silicon film 50 is deposited on the silicon oxide film 6. Thereby, the structure shown in FIG. 14A is completed.

Next, a solid epitaxial growth process is performed using as a core the surface portion of the silicon single crystal substrate 3 inside the opening 502. A laser annealing method for example is used as the solid epitaxial growth method in which the amorphous silicon film 50 is heated by a laser light. In this way, it is possible to form a portion of the amorphous silicon film 50 within a distance of about 10 $\mu$m from the opening 502 into a silicon single crystal having the same direction of crystal lattice planes as that of the substrate. As shown in FIG. 14B, a base electrode single crystal silicon film 51 and a collector electrode single crystal silicon film 52 are formed by patterning a silicon film 50 which is at least partially single-crystallized in such a way. Thereby, the structure of FIG. 14B is completed.

After this, a silicon nitride film 8 is formed all over the wafer. A photoresist film not shown in the drawing is formed on the silicon nitride film 8 and patterned by using an exposure mask. The silicon nitride film 8 and the base electrode single crystal silicon film 51 are selectively removed by using the patterned photoresist film as an etching mask. Thereby, as shown in FIG. 15, an opening 501 is formed. This opening 501 corresponds to the opening 101 of the first embodiment. In this case, if an exposure mask for patterning the photoresist film is previously designed, for example, as dimensions by which the structure having dimensions shown in FIG. 13 can be formed, an opening 501 can be formed within about 5 $\mu$m from the opening 502. Accordingly, the opening 501 is contained sufficiently in the single-crystallized region. This opening 501 penetrates through the silicon nitride film 8 and the base electrode single crystal film 51. In other words, the side surface of the silicon film 51 exposed in the opening 501 is a single crystal surface.

Since processes after this are the same as those after forming the opening 101 of the first embodiment, description of them is omitted.

It is a matter of course that using single crystal silicon in place of electrode polysilicon portions in such a way can be applied to a bipolar transistor of the second embodiment and a field effect transistor (FET) of the third embodiment.

In this way, the side surface portion of the base electrode single crystal silicon film 51 exposed by the opening 501 is a single crystal. Therefore, the silicon film 53 grown at the exposed portions of the side surface and the lower surface of the base electrode single crystal silicon film 51 is also a single crystal, and thickness thereof becomes uniform and does not disperse. This silicon film 53 corresponds to the polysilicon film 12 of the first embodiment. In this embodiment, it is not always necessary to make the thickness $W_D$ of the side wall spacer composed of the silicon nitride film 10 and the silicon oxide film 9 being left on the inner surface of the opening 501 thicker than the thickness of the silicon film 53 grown from the exposed portion of the side surface of the base electrode single crystal silicon film 51 exposed in the opening 501. This is because, according to this embodiment, the thickness of the silicon film 53 can be precisely controlled.

Figure 16:
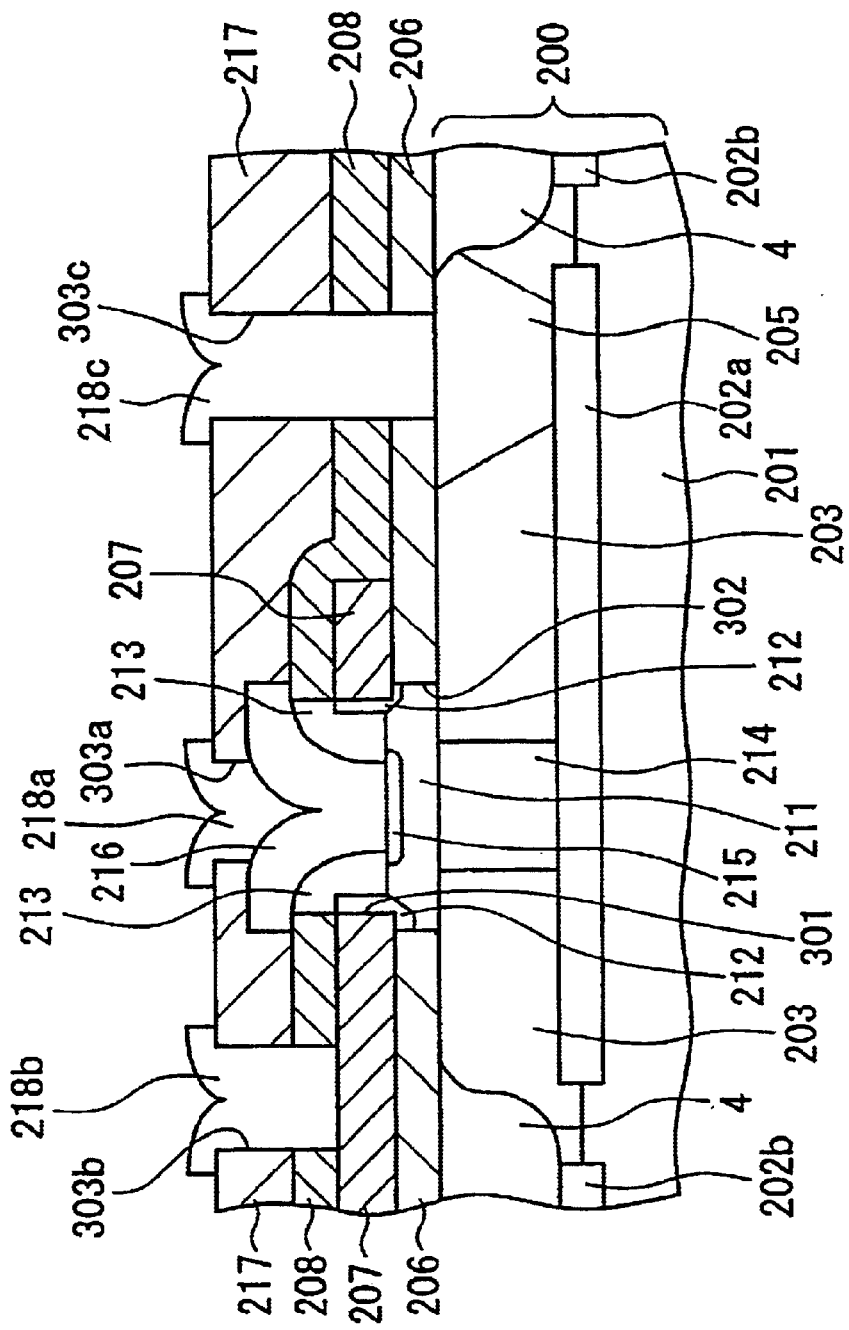
FIG. 16 is a vertical cross sectional view of a conventional semiconductor device.
Figure 17A:
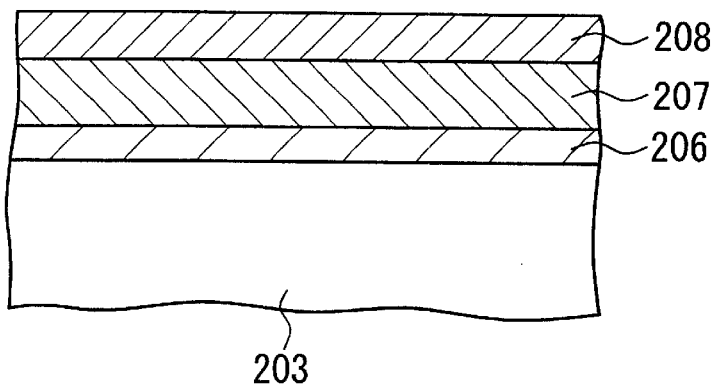
FIGS. 17A, 17B and 17C are vertical cross sectional views each showing a structure obtained during a process for manufacturing the conventional semiconductor device of FIG. 16.
Figure 17B:
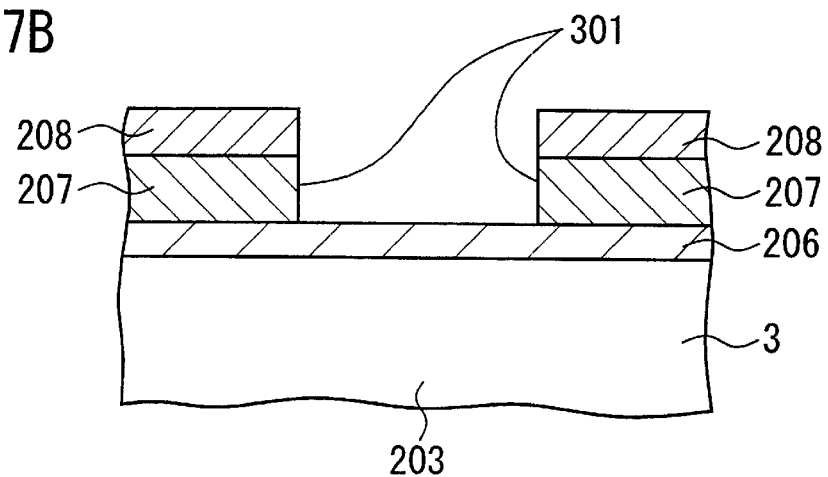
Figure 17C:
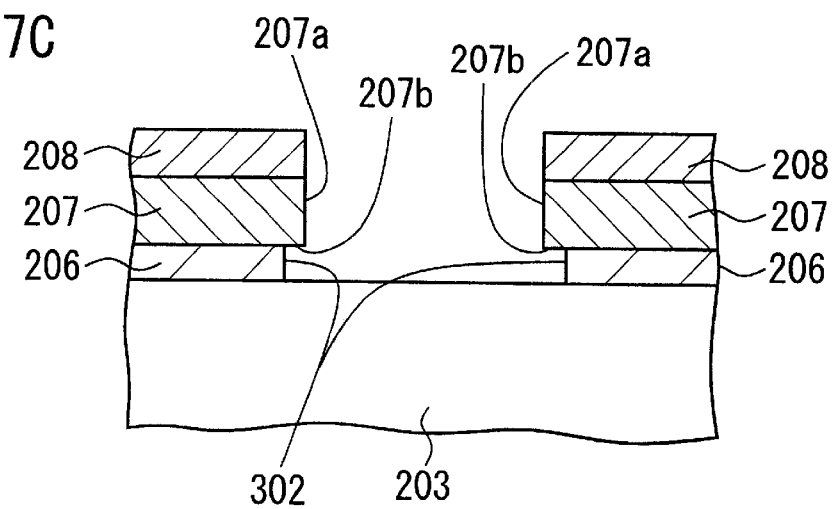

Furthermore, the side wall spacer composed of the silicon nitride film 10 and the silicon oxide film 9 left on the side surface of the opening 501 can be omitted according to circumstances. Therefore, for example, in the conventional semiconductor device of FIG. 16, in place of the polysilicon film 207, it is possible to use the single crystal silicon film 51 of this embodiment to obtain advantageous effect.

As described above, according to the present invention, the size of an opening for forming an emitter electrode polysilicon film on an intrinsic base or the size of an opening for forming a gate electrode polysilicon film on a channel layer is not influenced by the thickness of a polycrystalline film epitaxially growing from the side surface of the polysilicon film for the base electrode or source/drain electrode, but is defined by the side wall spacer formed on a portion of the side surface of the base electrode or source/drain electrode polysilicon film. As a result thereof, even when a polycrystalline film epitaxially grown from the side surface of a base electrode or source/drain electrode polysilicon film varies in thickness, emitter area or gate region area hardly disperses. Therefore, electric characteristics do not disperse but become stable.

Furthermore, according to the present invention, since a silicon film for the base electrode or source/drain electrode is single-crystallized, a silicon film epitaxially grown from the side surface of the single-crystallized silicon film for a base electrode or source/drain electrode does not vary in thickness. Therefore, an opening for forming an emitter electrode polysilicon film on an intrinsic base or an opening for forming a gate electrode polysilicon film on a channel layer does not vary in size. Accordingly, variation in emitter area or gate region area is greatly suppressed, and electric characteristics of a semiconductor device do not disperse but become stable.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative sense rather than a restrictive sense, and all such modifications are to be included within the scope of the present invention. Therefore, it is intended that this invention encompasses all of the variations and modifications as fall within the scope of the appended claims.

What is claimed is:

1. A semiconductor device comprising:

a single crystal semiconductor substrate of a first conductivity type;

a first insulating film which is formed on the main surface of said single crystal semiconductor substrate and which has a first opening having a first width to expose a portion of said main surface of said single crystal semiconductor substrate;

a first semiconductor layer extending toward an inner portion of said first opening equidistantly from an edge of said first opening and having a second conductivity type opposite to said first conductivity type;

a second insulating film formed on said first semiconductor layer and on a portion of said first insulating film where said first semiconductor layer does not exist;

a second opening which is formed so as to penetrate said first semiconductor layer and said second insulating film and which is position ally aligned with said first opening, said second opening having a second width which is less than said first width and projecting toward the inner portion of said first opening equidistantly from the edge of said first opening, so that the side surface of said first semiconductor layer corresponding to the inner wall surface of said second opening projects toward the inner portion of said first opening from the side surface of said first insulating film corresponding to the inner wall surface of said first opening;

an insulating side wall spacer formed at least on a portion of one of the side surface of said first semiconductor layer and of the side surface of said second insulating film corresponding to the inner wall surface of said second opening so as to expose the lower portion of the side surface of said first semiconductor layer corresponding to the inner wall surface of said second opening;

a second semiconductor layer composed of a single crystal semiconductor of said second conductivity type formed on said portion of the main surface of said single crystal semiconductor substrate exposed at the bottom surface of said first opening;

a third semiconductor layer of said second conductivity type for joining said exposed lower portion of the side surface of said first semiconductor layer corresponding to the inner wall surface of said second opening, and a portion of the lower surface of said first semiconductor layer in the proximity of the side surface of said first semiconductor layer corresponding to the inner wall surface of said second opening, to the end portion of said second semiconductor layer;

a fourth semiconductor layer of said first conductivity type formed at a region in the proximity of the upper surface of said second semiconductor layer; and a fifth semiconductor layer of said first conductivity type formed on the upper surface of said second semiconductor layer;

wherein a thickness of said third semiconductor layer is less than a thickness of said insulating side wall spacer; and wherein said insulating side wall spacer is formed by a first insulating side wall spacer portion formed on a portion of the side surface of said first semiconductor layer and of the side surface of said second insulating film corresponding to the inner wall surface of said second opening so as to expose the lower portion of the side surface of said first semiconductor layer corresponding to the inner wall surface of said second opening, and a second insulating side wall spacer portion which is directly formed on said first insulating side wall spacer portion, and wherein the length of said second insulating side wall spacer portion along the direction parallel to the inner wall of said second opening is longer than the length of said first insulating side wall spacer portion along the direction parallel to the inner wall of said second opening, and wherein said second side wall spacer portion is not in contact with said second semiconductor layer.

2. A semiconductor device according to claim 1, further comprising:
   a third insulating film which covers at least a portion of said insulating side wall spacer and said second semiconductor layer.

3. A semiconductor device according to claim 1, wherein at least a portion of said first semiconductor layer includes single crystal semiconductor, said second opening penetrates the portion of single crystal semiconductor of said first semiconductor layer, and said third semiconductor layer includes single crystal semiconductor.

4. A semiconductor device comprising:
   a single crystal semiconductor substrate of a first conductivity type;
   a first insulating film which is formed on the main surface of said single crystal semiconductor substrate and which has a first opening having a first width to expose a portion of said main surface of said single crystal semiconductor substrate;
   a first semiconductor layer formed on at least a portion of said first insulating film and having a second conductivity type opposite to said first conductivity type;
   a second insulating film formed on said first insulating film so as to cover said first semiconductor layer;
   a second opening which is formed so as to penetrate said first semiconductor layer and said second insulating film and which is positionally aligned with said first opening, said second opening having a second width which is less than said first width, so that the side surface of said first semiconductor layer corresponding to the inner wall surface of said second opening projects toward the inner portion of said first opening from the side surface of said first insulating film corresponding to the inner wall surface of said first opening;
   a second semiconductor layer composed of a single crystal semiconductor of said second conductivity formed on said portion of the main surface of said single, crystal semiconductor substrate exposed at the bottom surface of said first opening;
   an insulating side wall spacer formed at least on a lower portion of the side surface of said second insulating film and on an upper portion of the side surface of said first semiconductor layer corresponding to the inner wall surface of said second opening so as to expose the lower portion of the side surface of said first semiconductor layer corresponding to the inner wall surface of said second opening, wherein said insulating side wall spacer comprises at least first and second film portions, said first film portion is formed on a lower portion of a side surface of said second insulating film and on said upper portion of a side surface of said first semiconductor layer, said second film portion is directly formed on said first film portion, and said first film portion is made of the same material as that of said first insulating film, said second film portion not contacting said second semiconductor layer;
   a third semiconductor layer of said second conductivity type for joining said exposed lower portion of the side surface of said first semiconductor layer corresponding to the inner wall surface of said second opening, and a portion of the lower surface of said first semiconductor layer in the proximity of the side surface of said first semiconductor layer corresponding to the inner wall surface of said second opening, to the end portion of said second semiconductor layer;
   a fourth semiconductor layer of said first conductivity type formed at a region in the proximity of the upper surface of said second semiconductor layer; and
   a fifth semiconductor layer of said first conductivity type formed on the upper surface of said second semiconductor layer.

5. A semiconductor device according to claim 4, wherein a thickness of said third semiconductor layer is less than a thickness of said insulating side wall spacer.

6. A semiconductor device according to claim 5, wherein said single crystal semiconductor substrate includes single crystal silicon, said first semiconductor layer includes polysilicon, said second semiconductor layer includes single crystal silicon, and said third and fifth semiconductor layers includes polysilicon.

7. A semiconductor device according to claim 5, wherein said single crystal semiconductor substrate includes single crystal silicon, said first semiconductor layer includes polysilicon, said second semiconductor layer includes single crystal SiGe, said third semiconductor includes polycrystalline SiGe, and said fifth semiconductor includes polysilicon.

8. A semiconductor device according to claim 5, wherein said single crystal semiconductor substrate includes single crystal silicon, said first semiconductor layer includes single crystal silicon, said second semiconductor layer includes single crystal silicon, said third semiconductor layer includes single crystal silicon, and said fifth semiconductor layer includes polysilicon.

9. A semiconductor device according to claim 5, further comprising:
   a third insulating film which covers at least a portion of said insulating side wall spacer and said second semiconductor layer.

10. A semiconductor device according to claim 4, wherein at least a portion of said first semiconductor layer includes single crystal semiconductor, said second opening penetrates the portion of single crystal semiconductor of said first semiconductor layer, and said third semiconductor layer includes single crystal semiconductor.

11. A side wall spacer in a transistor, the transistor comprising a semiconductor electrode layer positioned between a first insulating layer and a second insulating layer, a semiconductor connector layer positioned on a side face and a bottom face of said electrode layer, and a semiconductor active layer adjacent to the connector layer, the side wall spacer comprising:
   a first insulating film positioned adjacent to said electrode layer and said second insulating layer, said first insulating film contacting said connector layer but not said active layer, wherein said first insulating film is thicker than said connector layer at the point of contact between said first insulating film and said connector layer;
   a second insulating film directly formed on said first insulating film, said second insulating film not in contact with said electrode layer, said first insulating layer, said second insulating layer, said connector layer, and said active layer; and
   a third insulating film directly formed on said second insulating film, said third insulating film in contact with said first insulating film, said connector layer, and said active layer, but separated from said electrode layer by said connector layer.

12. The side wall spacer of claim 11, wherein said first insulating film and said second insulating film comprise different materials.

13. The side wall spacer of claim 11, wherein said first insulating film and said second insulating film are made of the same material.

14. An electronic device, comprising:
a plurality of transistors, each transistor comprising:
a semiconductor collector layer of a first conductivity type;
a first insulating film formed on a surface of said collector layer, said first insulating film defining a first opening exposing a portion of said semiconductor collector layer;
a semiconductor base electrode layer formed on at least a portion of said first insulating film and having a second conductivity type opposite to said first conductivity type;
a second insulating film formed on said first insulating film so as to cover said base electrode layer, said second insulating film and said base electrode layer defining a second opening positionally aligned with said first opening so as to expose a side surface of said second insulating film and a side surface and at least a portion of a bottom surface of said base electrode layer;
a semiconductor connector layer formed on said side surface and said bottom surface of said base electrode layer;
a side wall spacer formed on at least a portion of said side surface of said second insulating film and at least a portion of said side surface of said base electrode layer, said side wall spacer having a thickness greater than the thickness of said connector layer, wherein said side wall spacer comprises a first insulating film positioned adjacent to said base electrode layer and said second insulating layer; a second insulating film directly formed on said first insulating film, said second insulating film not in contact with said base electrode layer, said first insulating layer, said second insulating layer, and said connector layer; and a third insulating film directly formed on said second insulating film, said third insulating film in contact with said first insulating film and said connector layer, but separated from said base electrode layer by said connector layer;
a semiconductor base layer having the second conductivity type connected to said connector layer; and
a semiconductor emitter having the first conductivity type connected to the base layer,
wherein the thickness of all of said side wall spacers of each of said plurality of transistors is substantially the same, and wherein each of said plurality of transistors has substantially the same base-emitter voltage when operating at the same collector current.

15. A device according to claim 14, wherein each said collector layer and base layer comprises single crystal silicon, and wherein each said base electrode layer, collector layer, and emitter comprises polycrystalline silicon.

16. A device according to claim 14, wherein each said collector layer comprises single crystal silicon, each said base electrode and each said emitter comprises polycrystalline silicon, each said base layer comprises single crystal SiGe, and each said connector layer comprises polycrystalline SiGe.

* * * * *